United States Patent
Cordaro et al.

(10) Patent No.: US 12,218,693 B2
(45) Date of Patent: Feb. 4, 2025

(54) LOW POWER DIGITAL PDM MICROPHONE INTERFACING FOR ALWAYS-ON APPLICATIONS

(71) Applicant: SYNTIANT, Irvine, CA (US)

(72) Inventors: Joseph Cordaro, Huntington Beach, CA (US); David Garrett, Tustin, CA (US)

(73) Assignee: SYNTIANT, Irvine, CA (US)

( * ) Notice: Subject to any disclaimer, the term of this patent is extended or adjusted under 35 U.S.C. 154(b) by 266 days.

(21) Appl. No.: 17/874,236

(22) Filed: Jul. 26, 2022

(65) Prior Publication Data

US 2024/0039555 A1 Feb. 1, 2024

(51) Int. Cl.
*H03M 3/00* (2006.01)
*G06F 1/10* (2006.01)
(Continued)

(52) U.S. Cl.
CPC .............. *H03M 3/458* (2013.01); *G06F 1/10* (2013.01); *H04R 1/406* (2013.01); *H04R 3/005* (2013.01);
(Continued)

(58) Field of Classification Search
CPC ... G06F 1/10; G06F 1/04; G06F 1/325; G06F 1/3278; H03K 19/21; H03M 3/458;
(Continued)

(56) References Cited

U.S. PATENT DOCUMENTS

2008/0313485 A1* 12/2008 Frank ................ H03K 3/35625
713/401
2013/0058495 A1* 3/2013 Furst .............. H03K 19/017509
381/80

(Continued)

*Primary Examiner* — Lun-See Lao
(74) *Attorney, Agent, or Firm* — Rutan & Tucker LLP; Hani Z. Sayed; Ravi Mohan

(57) ABSTRACT

An encoding technique for reducing the power of PDM microphones is disclosed. Digital MEMS microphones utilize a modulation technique called Pulse Density Modulation (PDM), where a single data line (PDMDAT) is used to convey the digital information from the microphone source to a receiver. A characteristic of PDM is that a low noise signal will produce the most transitions, a zero signal will produce an alternating bitstream of logic-1s and logic-0s, and low noise bitstreams will be rich in singleton and doubleton 1s/0s. Typically, CMOS drivers transmit the PDM bitstream signal. CMOS drivers consume power primarily when they transition, so a bitstream rich in singletons and doubletons will increase power consumption. Differential encoding with an XNOR function is used as a singleton-suppression encoder, and a differential encoding with an XOR function is used as a doubleton-suppression encoder. In some embodiments, such as a dual PDM microphone configuration, the microphones alternate sending data on the rising (transition to logic-1) and falling (transition to logic-0) edges of PDMCLK. In other embodiments, a Voice Activity Detection (VAD) function may be added. In some other embodiments, a suppressed clock pulse duration modulator may be added.

10 Claims, 20 Drawing Sheets

(51) Int. Cl.
  *H03K 19/21*    (2006.01)
  *H04R 1/40*     (2006.01)
  *H04R 3/00*     (2006.01)
  *H04R 19/04*    (2006.01)

(52) U.S. Cl.
  CPC ............ *H04R 19/04* (2013.01); *H03K 19/21* (2013.01); *H04R 2201/003* (2013.01)

(58) Field of Classification Search
  CPC .. H04R 1/406; H04R 19/04; H04R 2201/003; H04R 3/005; H04R 2460/03
  USPC ............... 381/92, 56–58, 18–24; 700/94
  See application file for complete search history.

(56) References Cited

U.S. PATENT DOCUMENTS

| | | | | |
|---|---|---|---|---|
| 2014/0132304 A1* | 5/2014 | Haiut | ............... | H04R 3/005 327/155 |
| 2014/0348345 A1* | 11/2014 | Furst | ............... | G06F 1/324 381/111 |
| 2016/0249122 A1* | 8/2016 | Popper | ............... | B81B 7/008 |
| 2018/0063638 A1* | 3/2018 | Bini | ............... | G10K 11/346 |
| 2019/0132682 A1* | 5/2019 | Fan | ............... | H03K 5/133 |

\* cited by examiner

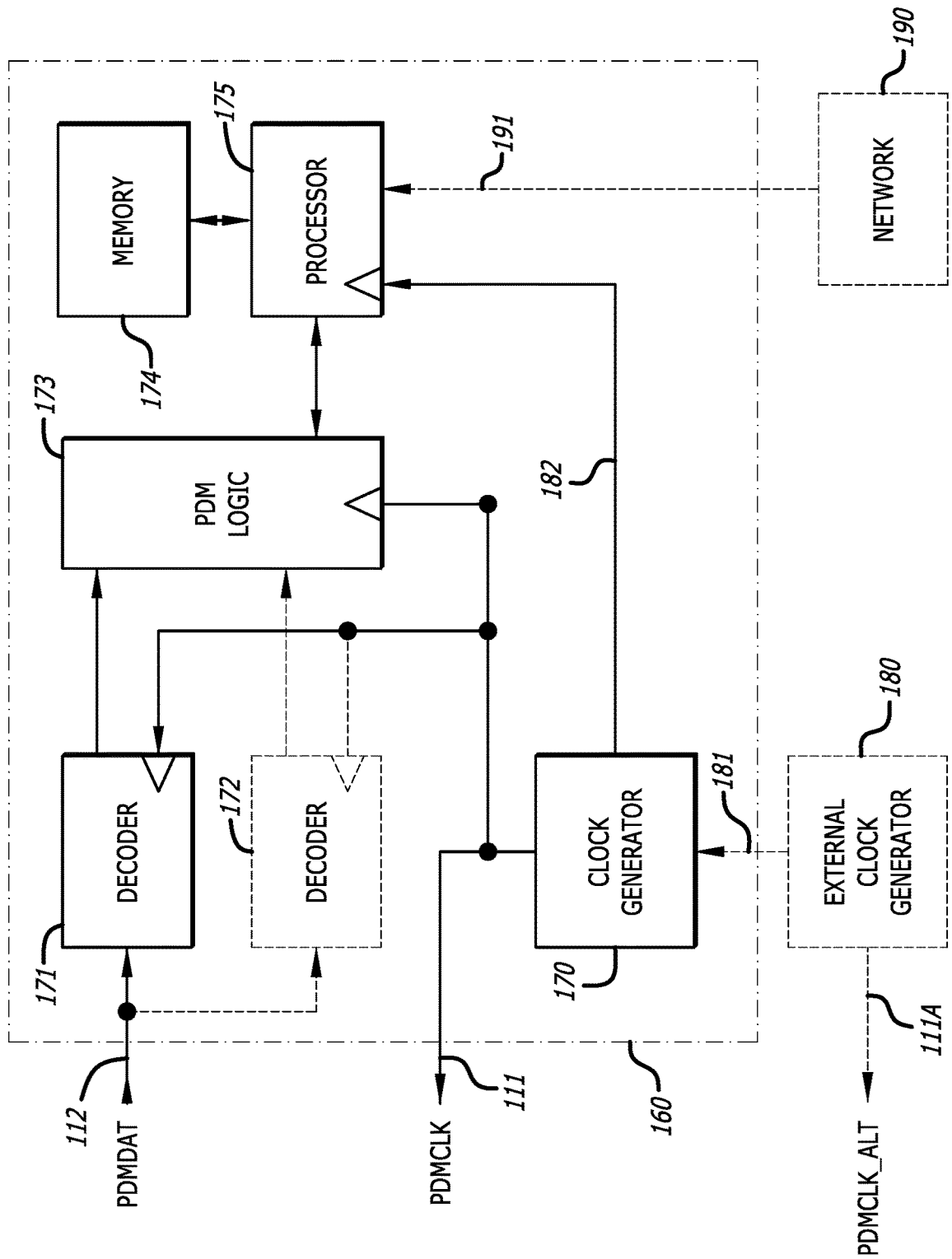

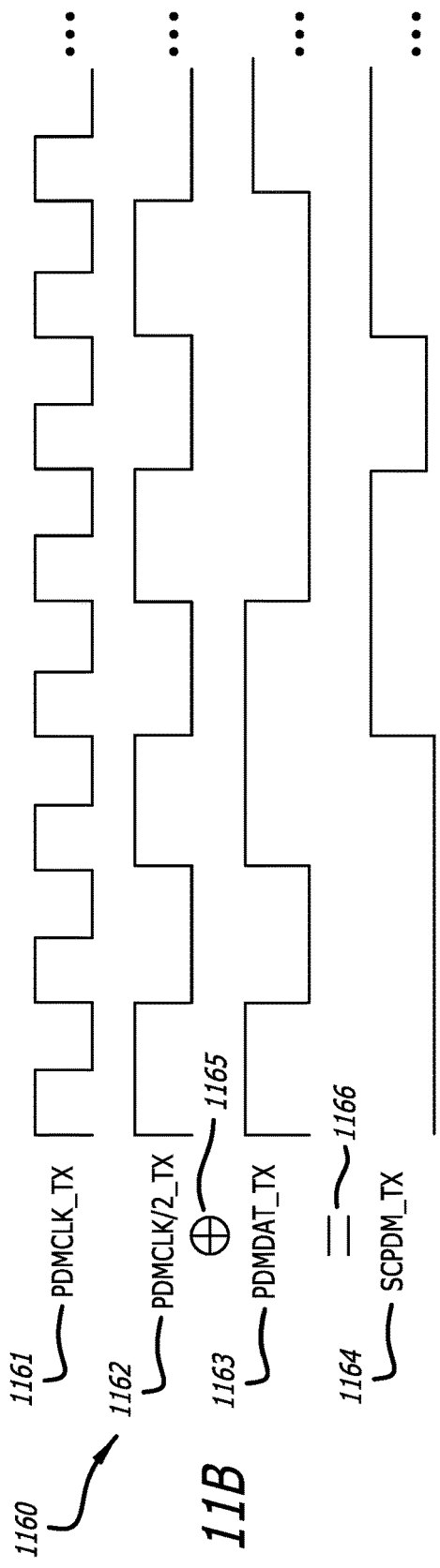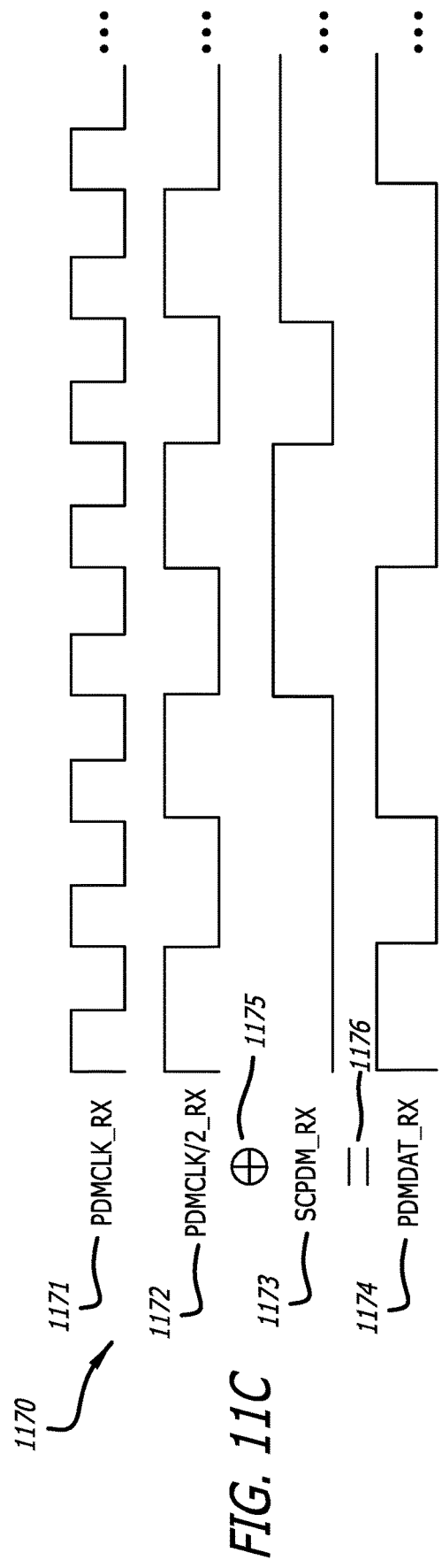

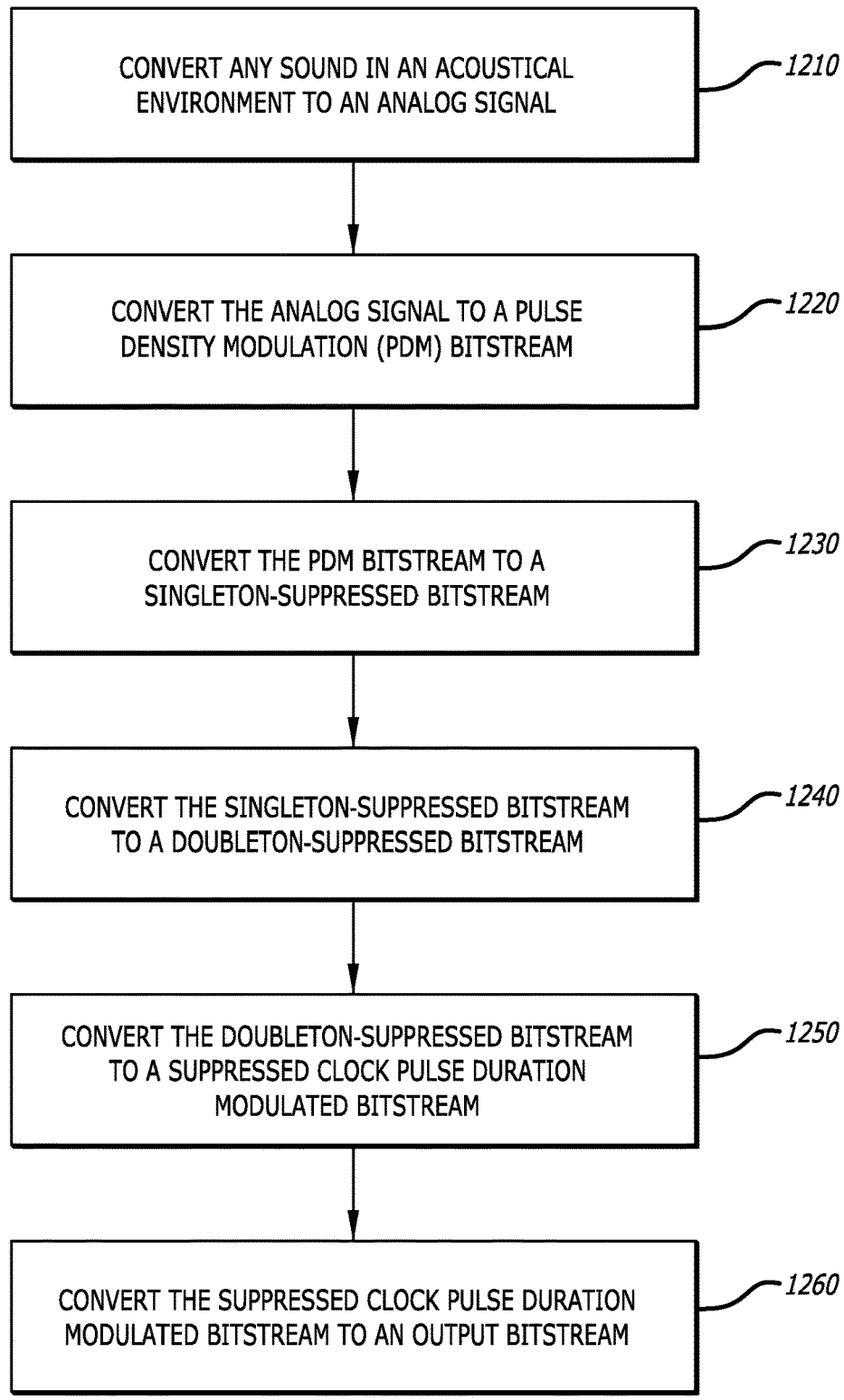

LOW POWER DIGITAL PDM MICROPHONE INTERFACING FOR ALWAYS-ON APPLICATIONS

RELATED APPLICATION

This application is related to co-pending application Ser. No. 17/874,210, filed Jul. 26, 2022, having common ownership and is included herein by reference in its entirety.

FIELD

The present disclosure relates to Pulse Density Modulation (PDM) Microphone interfacing. More particularly, the present disclosure relates to efficient low power signaling in always-on applications with a wide dynamic range.

BACKGROUND

Microphones are commonly made using silicon microelectromechanical system (MEMS) technology. MEMS microphones are often used as transducers for capturing sound in digital systems, including, for example, cellular phones and laptop computers. MEMS microphones can be analog or digital, converting the sound waves into a discrete, digital signal inside the microphone enclosure. Digital MEMS microphones can provide the audio to a host using various methods. One method is to utilize Pulse Density Modulation.

In prior designs, the Pulse Density Modulation (PDM) Microphone power consumption was a small fraction of the total system power because the host which processed the PDM audio, such as a cellphone or earbud, consumed much more power than the microphone did. The advent of low-power wearable always-on neural chips to listen to and process voice means that the device processing the microphone data consumes substantially less power than before.

Digital MEMS microphones utilize high-order sigma-delta modulation to provide noise shaping in the analog to digital conversion (ADC) process and a modulation technique called Pulse Density Modulation (PDM), where a single data line (PDMDAT) is used to convey the digital information from the microphone source to a device, such as a Wake Word detection IC, or cellular phone, which processes the audio. A clock for the PDM microphone (PDMCLK) is provided by another source, such as a Wake Word detection IC or host processor. PDM microphones may send data on the rising ("Right") or falling ("Left") edge of the PDMCLK clock, depending on how the microphone is configured.

Sound waves have a tremendous dynamic range. This means quiet sounds, when converted to a continuous electrical signal, are represented by an extremely small voltage compared to high acoustic energy events. For this reason, digital MEMS microphones are often preferred over analog microphones in modern devices because analog microphones are very sensitive to noise.

Digital MEMS microphones have higher power consumption than analog MEMS microphones due in large part to the switching of the digital inputs and outputs. Because of the increase in power consumption, an analog microphone is frequently used to save power. Often, analog microphones and digital microphones are combined in a system, raising system complexity and cost. A designer, to avoid the complications of using analog microphones, may opt to use digital microphones in a system. A way to avoid dissipating a large fraction of the total system power in the digital microphone interface is highly desirable.

BRIEF DESCRIPTION OF DRAWINGS

The above and other aspects, features, and advantages of several embodiments of the present disclosure will be more apparent from the following description is presented in conjunction with the following several figures of the drawings.

FIG. 1C is a schematic block diagram of a host configured to interface with a PDM microphone in accordance with an embodiment of the disclosure;

FIG. 11B is a waveform diagram of the operation of a PDM microphone with suppressed clock pulse duration modulation transmitter in accordance with an embodiment of the disclosure;

FIG. 11C is a waveform diagram of the operation of a PDM microphone with suppressed clock pulse duration modulation receiver in accordance with an embodiment of the disclosure; and FIG. 12 is a flowchart depicting a process of operating a PDM microphone in accordance with an embodiment of the disclosure.

Figure 1A:
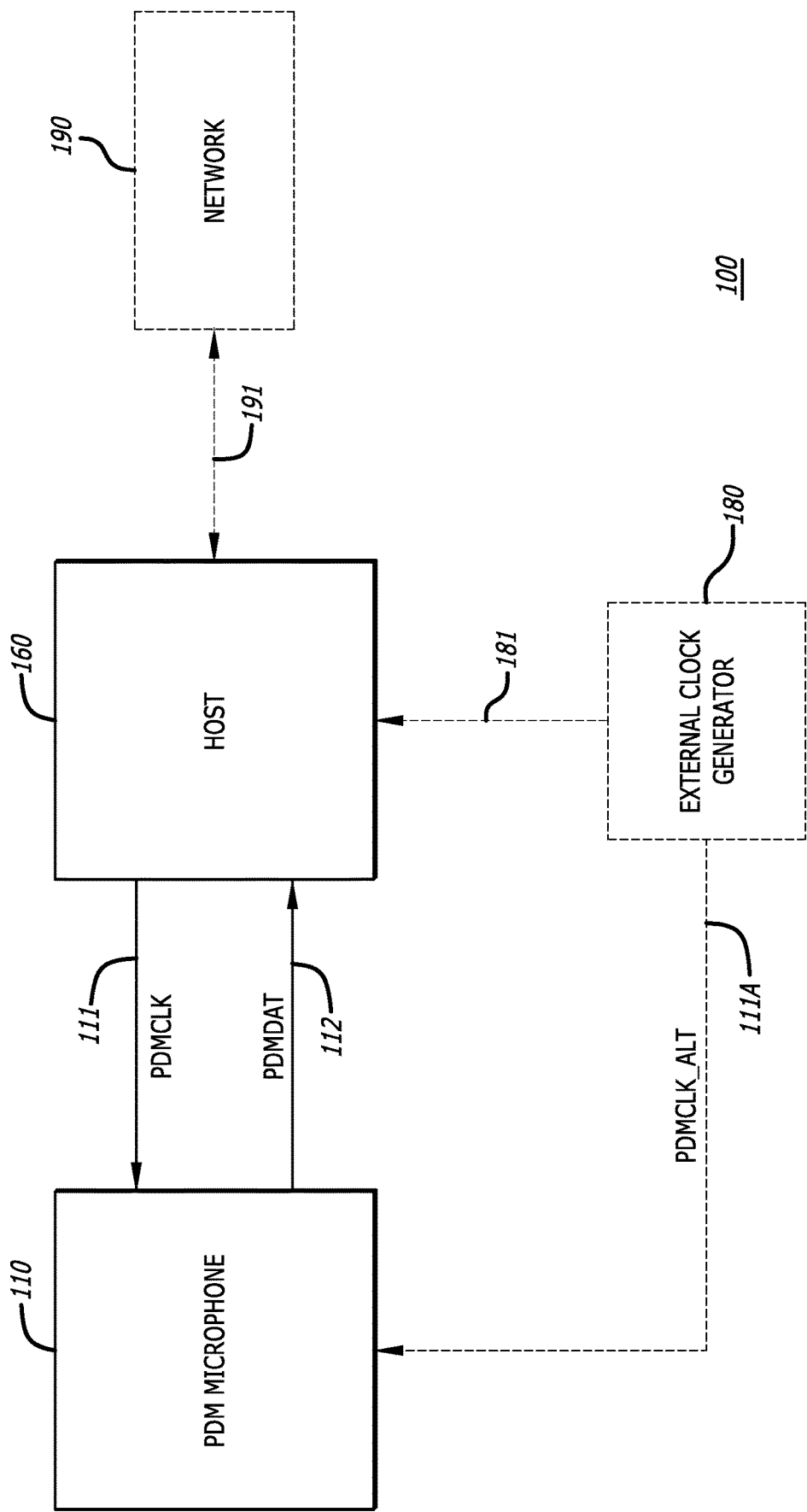
FIG. 1A is a schematic block diagram of a system employing a PDM microphone in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common but well-understood elements that are useful or necessary in a commercially feasible embodiment are often not depicted in order to facilitate a less obstructed view of these various embodiments of the present disclosure.

DETAILED DESCRIPTION

In response to the situations described above, an encoding technique for reducing the power of PDM microphones is disclosed. Digital MEMS microphones utilize high-order sigma-delta modulation to provide noise shaping in the analog to digital conversion (ADC) process and a modulation technique called Pulse Density Modulation (PDM), where a single data line (PDMDAT) is used to convey the digital information from the microphone source to a device, such as a Wake Word detection IC, or cellular phone, which processes the audio. A characteristic of PDM is that lower signal level produces more transitions than higher signal levels. A zero signal in low-order sigma-delta modulation will produce an alternating bitstream of logic-1s and logic-0s.

In a bitstream, a single logic-1 immediately preceded by a logic-0 and followed by a logic-0 is called a logic-1 singleton, and a single logic-0 immediately preceded by a logic-1 and immediately followed by a logic-1 is called a logic-1 singleton. Similarly, two consecutive logic-1s immediately preceded by a logic-0 and immediately followed by a logic-0 is called a logic-1 doubleton, and two consecutive logic-0s immediately preceded by a logic-1 and immediately followed by a logic-1 is called a logic-0 doubleton. Higher order sigma delta modulation intersperses bursts of singletons and doubletons with longer streams of logic-0 and logic-1 signals. Thus typical low-signal level bitstreams will be rich in singletons and doubletons.

Typically, Complementary Metal-Oxide-Semiconductor (CMOS) logic is used to transmit or drive the bitstream signal from the PDM microphone to another device or host for processing the acoustic data. CMOS drivers consume power primarily when they transition from a logic-0 to a logic-1 or from a logic-1 to a logic-0. The formula for dynamic power consumption is $P_D = C_L * VDDIO^2 * NumTransitions$. Where $C_L$ is the load capacitance, VDDIO is the logic signaling level, and NumTransitions is the number of logic-0 to logic-1 and logic-1 to logic-0 transitions. Thus, a bitstream rich in singletons and doubletons will produce the highest CMOS power consumption.

Differential encoding with an XNOR function has the property of suppressing singletons and is used as a singleton-suppression encoder. A singleton-suppression encoder also has the property of converting doubletons to singletons. Differential encoding with an XOR function has the property of suppressing these additional singletons and is used as a doubleton-suppression encoder. Due to the linear nature of the XOR and XNOR functions, differential decoding can be used at the receiver to restore the original PDM bitstream for further processing.

A clock for the PDM microphone (PDMCLK) is provided by another source, such as a Wake Word recognition chip, the host processor, or some other device. PDM microphones send data on the rising ("Right") or falling ("Left") edge of the PDMCLK clock, depending on how the microphone is configured. In some embodiments, such as a dual PDM microphone configuration, the microphones alternate sending data on the rising (transition to logic-1) and falling (transition to logic-0) edges of PDMCLK. In other embodiments, a Voice Activity Detection (VAD) function may be added. In some other embodiments, a suppressed clock pulse duration modulator may be added.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but is not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C #, Objective C, or the like, conventional procedural programming languages, such as the "C" programming language, scripting programming languages, assembly languages, and/or other similar programming languages. The program code may execute partly or entirely on one or more of a user's computers and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as a field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, loading, storing, buffering, and/or transferring data can include the entirety of the data, a portion of the data, a set of the data, and/or a subset of the data. Likewise, reference to reading, writing, loading, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1A, a schematic block diagram of a system employing a PDM microphone in accordance with an embodiment of the disclosure is shown. Present in system 100 may be PDM microphone 110 and host 160. PDM microphone 110 may be coupled to host 160 by PDMCLK signal 111 and PDMDAT signal 112. PDMCLK 111 may be used as a clocking signal internally to PDM microphone 110 and internally to host 160. Although host 160 is illustrated as the source of PDMCLK 111, in some embodiments, PDMCLK_ALT 111A (optional) may be generated by another source like optional external clock generator 180 and used internally by both PDM microphone 110 and host 160 via clock line 181. In various embodiments, host 160 may be in communication with a network 190 via a communications link 191. Network 190 may be the Internet, a wired/wireless local network, or the like.

Figure 1B:
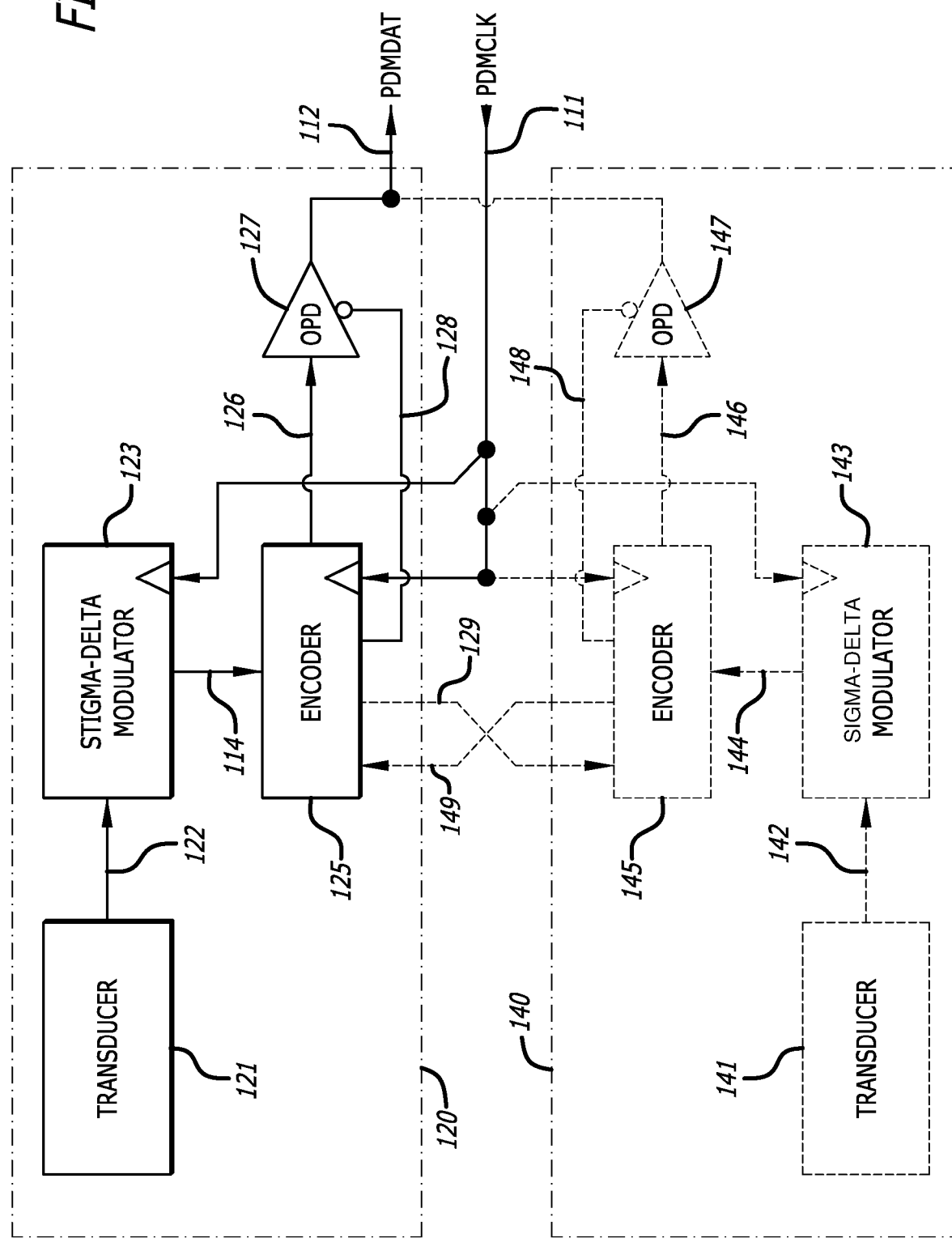
FIG. 1B is a schematic block diagram of a PDM microphone in accordance with an embodiment of the disclosure.

Referring to FIG. 1B, a schematic block diagram of a PDM microphone in accordance with an embodiment of the disclosure is shown. Systems employing PDM microphones may have a single microphone in many embodiments and two (dual) microphones in many other embodiments. The two microphones may be located in the same package or be separate. The first microphone may be generally indicated by host 120 and the associated blocks and interconnections by solid lines. The second microphone may be generally indicated by host 120 and the associated blocks and interconnections by dashed lines.

Transducer 121 may be a MEMS microphone that monitors sound in an acoustic environment and converts it to an analog signal 122. Sigma-delta modulator 123 may convert analog signal 122 to a digital PDM bitstream signal 114 in an Analog-to-Digital Converter (ADC) function. Sigma-delta modulator 123 may be a high-order sigma-delta modulator, but the exact order is a matter of design choice. Encoder 125 may comprise a singleton-suppression encoder followed by a doubleton-suppression encoder. This may convert PDM bitstream 124 into doubleton-suppressed bitstream 126. Output driver 127 may have a data input coupled to doubleton-suppressed bitstream 126, an enable input coupled to encoder 125 by enable signal 128, and an output coupled to the PDMDAT 112 output signal pad (not shown).

If present, transducer 141 may be a MEMS microphone that monitors sound in a second acoustic environment and converts it to an analog signal 142. Transducers 121 and 141 may be in the same physical space, area, casing, or enclosure, but each may be considered to have its own unique acoustic environment due to the different physical locations. Sigma-delta modulator 143 may convert analog signal 142 to a digital PDM bitstream signal 144 in an Analog-to-Digital Converter (ADC) function. Sigma-delta modulator 143 may be a high-order sigma-delta modulator, but the exact order is a matter of design choice. Encoder 145 may comprise a singleton-suppression encoder followed by a doubleton-suppression encoder. This may convert PDM bitstream signal 144 into doubleton-suppressed bitstream 146. Output driver 147 may have a data input coupled to doubleton-suppressed bitstream 146, an enable input coupled to encoder 145 by enable signal 148, and an output coupled to the PDMDAT 112 input signal pad (not shown). In certain embodiments, both encoders 125 and 145 may output a communication signal between them such that encoder 125 outputs a signal 129 to encoder 145 and encoder 145 outputs a signal 149 to encoder 129

PDMCLK input signal 111 may drive all of the synchronous elements in PDM microphone 110. It may be said to have two phases, one in the logic-1 state (or "rising edge," since sequential elements typically transition on one clock edge) and the other in the logic-0 state (or "falling edge"). Some combinational circuits may accept PDMCLK 111 as an input to control a function differently in the two phases.

In a dual microphone embodiment, output driver 127 may drive PDMDAT 112 during a first phase of PDMCLK 111 and may be disabled, deactivated, or present a high-impedance output (with or without a weak pulldown) to PDMDAT 112 during a second phase of PDMCLK 111. Similarly, in the dual microphone mode, output driver 147 may drive PDMDAT 112 during the second phase of PDMCLK 111 and may be disabled, deactivated, or present a high-impedance output (with or without a weak pulldown) to PDMDAT 112 during the first phase of PDMCLK 111. This may combine doubleton-suppressed bitstream 126 with doubleton-suppressed bitstream 146 into a single output bitstream on the one wire PDMDAT 112.

In a single microphone embodiment, output driver 127 may drive PDMDAT 112 during a first phase of PDMCLK 111 and may be disabled, deactivated, or present a high-impedance output (with or without a weak pulldown) to PDMDAT 112 during a second phase of PDMCLK 111. In an alternate single microphone embodiment, output driver 127 may drive PDMDAT 112 during the entire PDMCLK 111 period.

Referring to FIG. 1C, a schematic block diagram of a host configured to interface with a PDM microphone in accordance with an embodiment of the disclosure is shown. Host 160 may comprise clock generator 170, which may drive PDMCLK 111 off-chip. In some embodiments, clock generator 170 may generate PDMCLK 111 with an internal oscillator, crystal oscillator, phase-locked loop, etc. In other embodiments, clock generator 170 may distribute PDMCLK 111 derived from an optional external clock generator 180 via clock line 181. In alternate embodiments, external clock generator 180 may optionally provide PDMCLK_ALT 111A directly to PDM microphone 110 (not shown) as well as to clock generator 170. Clock generator 170 may distribute phase-adjusted versions of PDMCLK 111 internally to host 160 to ease timing constraints. Clock generator 170 may also produce other clocks for use internal to host 160 like, for example, processor clock 182 for processor 175.

PDMCLK 111 may also be distributed to the PDMCLK domain internal to host 120, which comprises decoder 171, optional decoder 172, and PDM logic 173. Decoder 171 may be used in both single microphone and dual microphone embodiments, while optional decoder 172 may only be used in dual microphone embodiments. Decoder 171 and optional decoder 172 each may comprise a doubleton-suppression decoder followed by a singleton-suppression decoder which reverses the singleton-suppression encoding and the doubleton-suppression encoding operations performed in the PDM microphone 110 (not shown). PDM logic 173 combined with software stored in memory 174 and/or executing in processor 175 may perform the necessary data processing on the reconstructed PDM bitstream. In various embodiments, processor 175 may be connected to an external network 131 via communications link 191.

Figure 2:
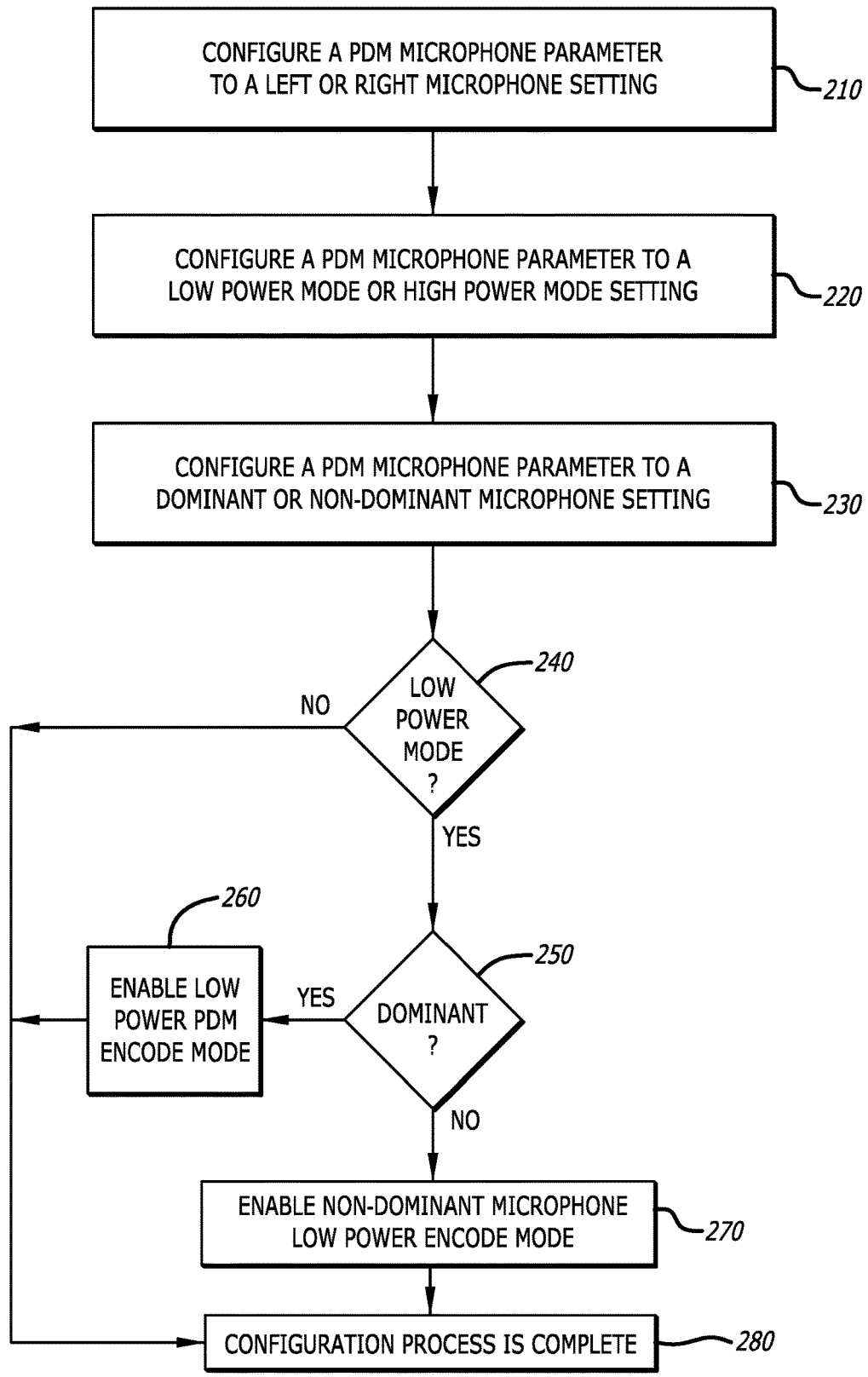
FIG. 2 is a flowchart depicting a process of operating a PDM microphone in accordance with an embodiment of the disclosure.

Referring to FIG. 2, a flowchart depicting a process 200 of operating a PDM microphone in accordance with an embodiment of the disclosure is shown. A PDM microphone may have a number of control parameters that may be set to a number of values during a configuration or initialization period. In some embodiments, there may be more than one microphone, in which case a host or other controller may configure the microphone to behave appropriately with respect to the other microphone. In various embodiments, one microphone may be dominant and the other non-dominant, and each may need to know which role to play. In other embodiments, a microphone may be part of the left sound channel or the right sound channel, and, again, each may need to know which role to play. This may determine whether the microphone is active driving a PDMDAT signal on one clock phase or the other.

Process 200 may begin by configuring a first parameter to determine if the microphone is to be operated as a left microphone or a right microphone (block 210). The configuration process may continue by configuring a second parameter to determine if the microphone is to be operated in a low power mode or a high power mode (block 220) and configuring a third parameter to determine if the microphone is to be operated as a dominant microphone or a non-dominant microphone (block 230).

A determination may be made by querying the second parameter as to whether the microphone is to operate in low power mode (block 240). If no, then the configuration process is complete (block 280). If yes, a determination may be made by querying the third parameter as to whether the microphone is to operate as a dominant microphone (block 250). If yes, low-power PDM encoding is enabled (block 260), and the configuration process is complete (block 280). If no, non-dominant low power encoding is enabled (block 270), and the configuration process is complete (block 280).

Figure 3A:
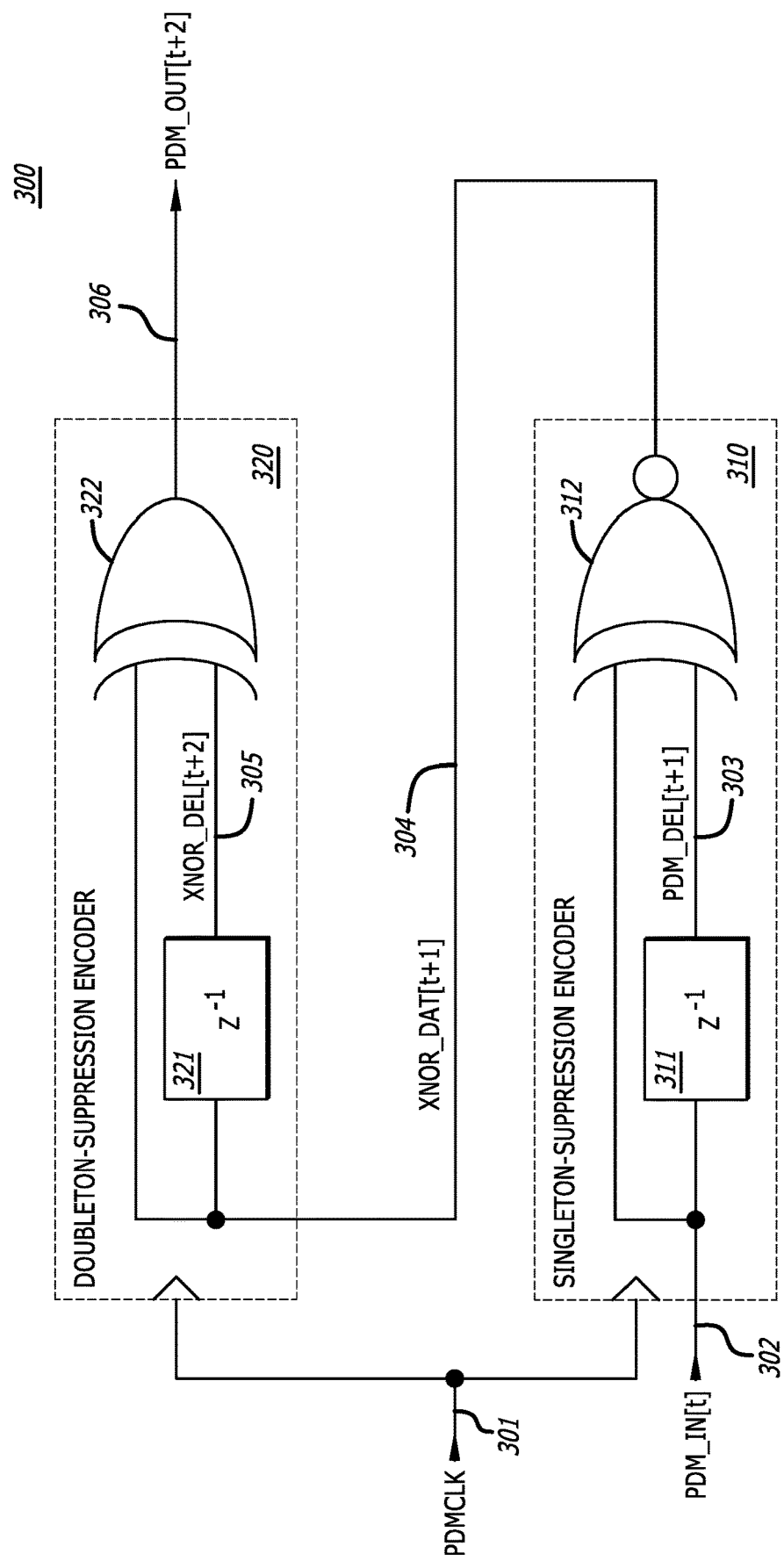
FIG. 3A is a schematic block diagram of a singleton-suppression encoder and a doubleton-suppression encoder in accordance with an embodiment of the disclosure.

Referring to FIG. 3A, a schematic block diagram of a singleton-suppression encoder and a doubleton-suppression encoder in accordance with an embodiment of the disclosure is shown. Encoder block 300 may comprise singleton-suppression encoder 310 and doubleton-suppression encoder 320. Signal PDMCLK 301 may be a clock coupled to singleton-suppression encoder 310 and doubleton-suppression encoder 320. Signal PDM_IN[t] 302 may be an input PDM bitstream of the sort generated by a sigma-delta modulator and may be synchronous to PDMCLK 301.

Singleton-suppression encoder 310 may comprise a delay element 311 (labeled $z^{-1}$) and an exclusive-NOR (XNOR) gate 312. PDM_IN[t] 302 may be coupled to an input of delay element 311 and a first input of XNOR gate 312. The output of delay element 311 may be coupled to signal PDM_DEL[t+1] 303, which may be in turn coupled to a second input of XNOR gate 312. The output of XNOR gate 312 is coupled to signal XNOR_DAT[t+1] 304. The signal XNOR_DAT[t+1] 304 may be referred to as a singleton-suppressed bitstream.

Doubleton-suppression encoder 320 may comprise a delay element 321 (labeled $z^{-1}$) and an exclusive-OR (XNOR) gate 322. Signal XNOR_DAT[t+1] 304 may be coupled to an input of delay element 321 and a first input of XNOR gate 322. The output of delay element 321 may be coupled to signal XNOR_DEL[t+2] 305, which may be in turn coupled to a second input of XNOR gate 322. The output of XNOR gate 322 is coupled to output signal PDM_OUT[t+2] 306. The signal PDM_OUT[t+2] 306 may be referred to as a doubleton-suppressed bitstream.

Delay elements 311 and 321 may be implemented in a variety of ways, like, for example, a D-flip/flop synchronous to PDMCLK 301. Each bit in the incoming PDM bitstream PDM_IN[t] 302 may be known as a symbol, as may be each bit in the various other signals 303-306 in the figure. The notation [t] in the figure may mean the number of a particular clock cycle, while the [t+1] may mean one clock cycle later than [t]. Thus, the value of PDM_DEL[t+1] 303 is the same symbol as PDM_IN[t] 302 one clock cycle earlier, having been delayed by one clock cycle by delay element 311. XNOR gate 312 performs a comparison of two adjacent symbols in the bitstream PDM_IN[t] 302 and produces a value of logic-0 on signal XNOR_DAT[t+1] 304 if the two symbols are different. Thus, singletons may be suppressed by this circuit since a singleton XORed with the following symbol (which must be different by definition) will always generate a logic-0.

Similarly, the value of XNOR_DEL[t+2] 305 is the same symbol as XNOR_DAT[t+1] 304 one clock cycle earlier, having been delayed by one clock cycle by delay element 321. XNOR gate 322 performs a comparison of two adjacent symbols in the bitstream PDM_IN[t] and produces a value of logic-1 if the two symbols are different. Thus, doubletons may be suppressed by this circuit since a doubleton XORed with the following symbol (which may be output as a singleton by singleton-suppression encoder 310) will always generate a logic-1.

Figure 3B:
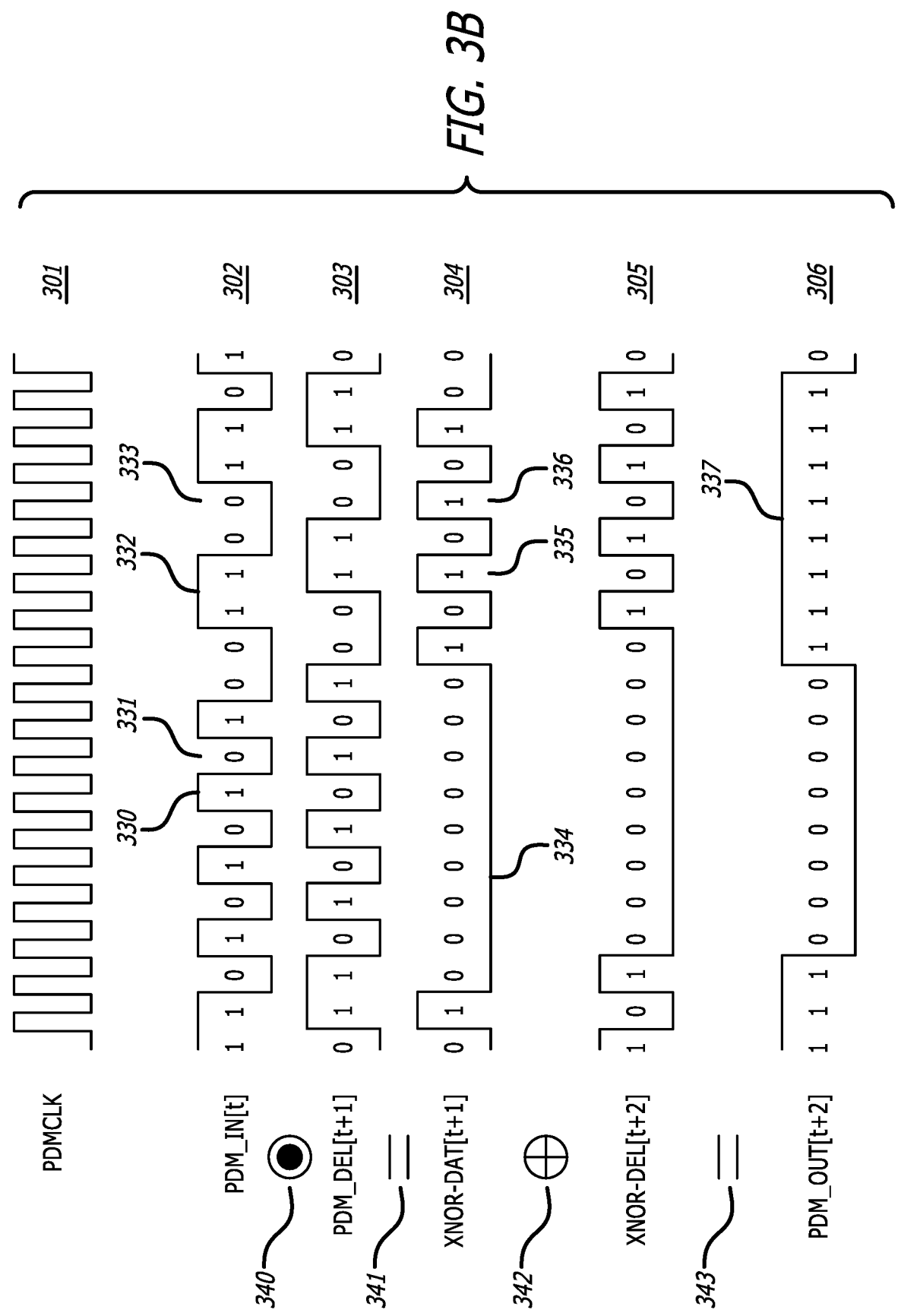
FIG. 3B is a waveform diagram of the operation of a singleton-suppression encoder and a doubleton-suppression encoder in accordance with an embodiment of the disclosure.

Referring to FIG. 3B, a waveform diagram of the operation of a singleton-suppression encoder and a doubleton-suppression encoder in accordance with an embodiment of the disclosure is shown. Present in the figure are six waveforms that correspond to the six signals PDMCLK 301, PDM_IN[t] 302, PDM_DEL[t+1] 303, XNOR_DAT[t+1] 304, XNOR_DEL[t+2] 305, and PDM_OUT[t+2] as discussed in conjunction with FIG. 3A. PDMCLK 301 may be a free-running clock comprising a series of alternating logic-1s and logic-0s. The time it takes to make a complete cycle may be called the clock period, and each of the two portions of the clock period may be called a phase. All of the other signals are synchronous to the rising edge (beginning of the logic-1 phase) of PDMCLK 301.

Waveform PDM_IN[t] 302 may be an exemplary PDM bitstream from a PDM source like, for example, a sigma-delta modulator. PDM_IN[t] 302 may comprise an exemplary logic-1 singleton 330, an exemplary logic-0 singleton 331, an exemplary logic-1 doubleton 332, and an exemplary logic-0 doubleton 333. A singleton of one logic value may have one bit of the opposite logic value immediately before and one bit of the opposite logic value immediately after. The bitstream sequence 01010101 in waveform 302 in the figure may comprise the logic-1 singleton 330 in the sixth bit position followed by the logic-0 singleton 331 in the seventh bit position.

Similarly, a doubleton of one logic value may have bits of the opposite logic value immediately before and immediately after. Notice that a doubleton of one logic value may have one bit of the opposite logic value immediately before and one bit of the opposite logic value immediately after. The bitstream sequence 00110011 in waveform 302 may comprise the logic-1 doubleton 332 in the third and fourth bit positions, followed by the logic-0 doubleton 333 in the fifth and sixth bit positions. The presence or absence of other doubletons may be irrelevant.

Waveform PDM_DEL[t+1] 303 may be the same as waveform PDM_IN[t] 302, only shifted one bit to the right (which may be the equivalent of delaying it by one PDMCLK cycle). At any clock cycle, the current bit and the previous bit are present at the same time in that clock cycle. The waveforms PDM_IN[t] 302 and PDM_DEL[t+1] 303 may be XNOR-ed together as represented by the XNOR character 340. The result of the XNOR function may be XNOR_DAT[t+1] 304 as represented by the equals character 341. The sequence of eight singletons in the original waveform PDM_IN[t] 302 may have been converted to a series of eight logic-0s 334. When shifted by one clock cycle, a singleton symbol XNOR-ed with its trailing symbol may always result in a logic-0 since, by definition, they may always be of opposite logic values. This may be the desired behavior of singleton-suppression encoder 310 in FIG. 3A. Also, doubletons 332 and 333 may have been transformed into singleton logic-1s 335 and 336, respectively.

Waveform XNOR_DAT[t+1] 304 may be the output of singleton-suppression encoder 310 as well as the input of doubleton-suppression encoder 320, both of FIG. 3A. Waveform XNOR_DEL[t+2] 305 may be waveform XNOR_DAT[t+1] 304 delayed by one clock cycle. Waveform XNOR_DEL[t+2] 305 may be XOR-ed with waveform XNOR_DAT[t+1] 304 as indicated by the XOR character 342 to produce waveform PDM_OUT[t+2] 306 as indicated by the equals character 343. The sequence of four doubletons in the original waveform PDM_IN[t] 302 may have been converted to a series of eight logic-1s 337 in the doubleton-suppressed bitstream PDM_OUT[t+2] 306. In waveform PDM_IN[t], the eight singletons followed by four doubletons resulted in 12 transitions over 16 PDMCLK 301 cycles, while in waveform PDM_OUT[t+2], that has been reduced to two transitions.

While this exemplary case is somewhat idealized for clarity of understanding, low or zero noise PDM bitstreams may produce lots of singletons and doubletons from a sigma-delta modulator and reducing the high number of transitions may save power. In fact, a zero-noise PDM signal may produce an alternating sequence of logic-1s and logic-0s, which may produce the counterintuitive result that the cases with the lowest acoustic noise may produce the highest power transmitting the digital version of that acoustic signal to a host or other device for processing.

Figure 3C:
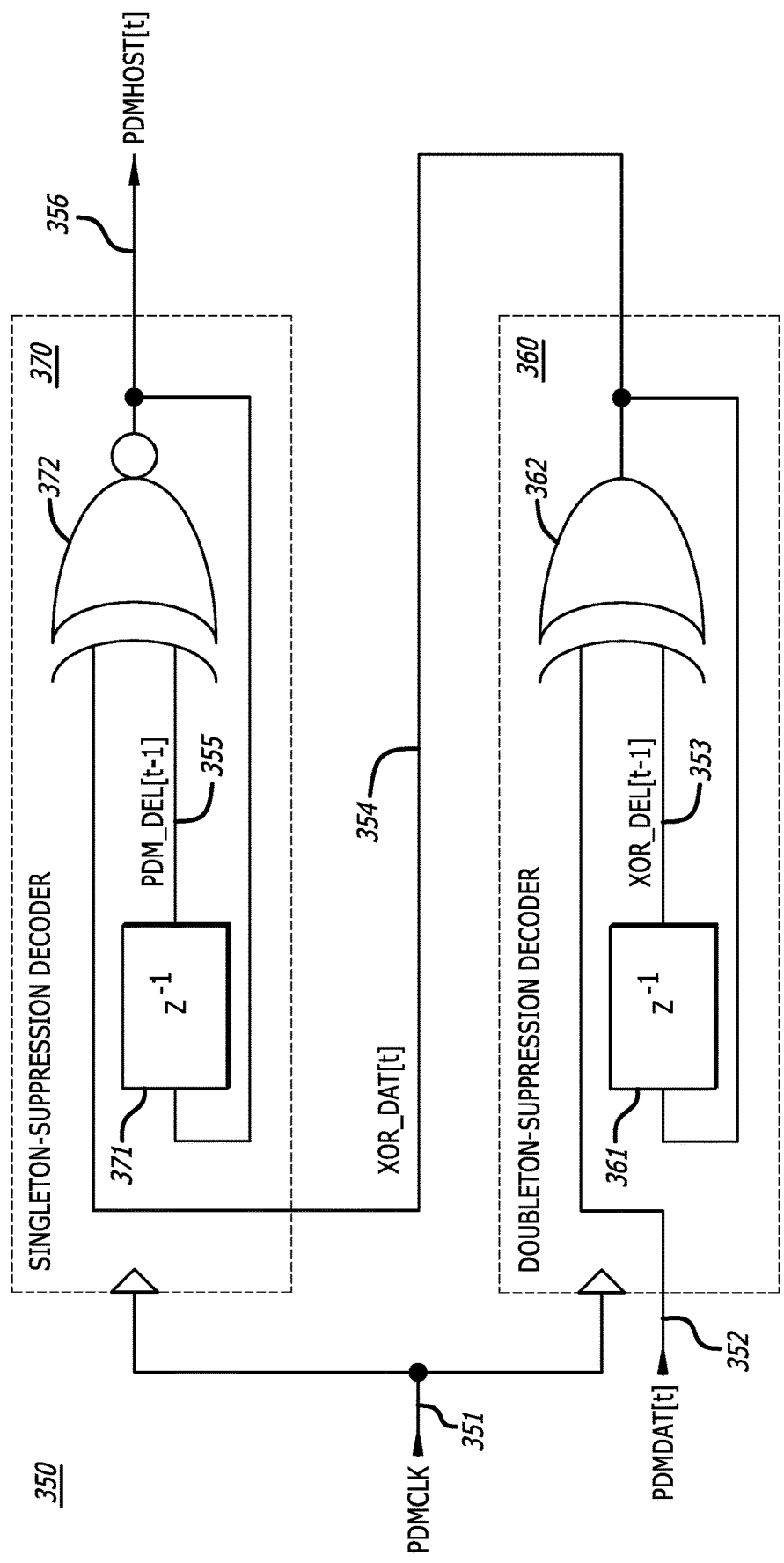
FIG. 3C is a schematic block diagram of a doubleton-suppression decoder and a singleton-suppression decoder in accordance with an embodiment of the disclosure.

Referring to FIG. 3C, a schematic block diagram of a doubleton-suppression decoder and a singleton-suppression decoder in accordance with an embodiment of the disclosure is shown. Decoder 350 may reverse the encoding performed by encoder block 300 of FIG. 3A. Decoder 350 may comprise doubleton-suppression decoder 360 in series with singleton-suppression decoder 370. Since the doubletons may be encoded last, they may be decoded first. Signal PDMCLK 351 may be a clock coupled to doubleton-suppression decoder 360 and singleton-suppression decoder 370. Signal PDMDAT[t] 352 may be a doubleton-suppressed bitstream of the sort generated by encoder block 300 of FIG. 3A and may be synchronous to PDMCLK 351.

Doubleton-suppression encoder 360 may comprise a delay element 361 (labeled $Z^{-1}$) and an XOR gate 362. Signal PDMDAT[t] 352 may be coupled to a first input of XOR gate 362. The output of XOR gate 362 may be coupled to signal XOR_DAT[t] 404 and the input of delay element 361. The output of delay element 361 may be coupled to signal XOR_DEL[t−1] 353, which may be, in turn, be coupled to a second input of XOR gate 362.

Singleton-suppression decoder 370 may comprise a delay element 371 (labeled $Z^{-1}$) and an XNOR gate 372. Signal XOR_DAT[t] 354 may be coupled to a first input of XNOR gate 322. The output of delay element 371 may be coupled to signal PDM_DEL[t−1] 355, which may be in turn coupled to a second input of XNOR gate 372. The output of XNOR gate 372 may be coupled to output signal PDMHOST[t] 356 and also coupled to the input of delay element 371.

Delay elements 361 and 371 may be implemented in a variety of ways, like, for example, a D-flip/flop synchronous to PDMCLK 351. Each bit in the incoming PDM bitstream PDMDAT[t] 352 may be known as a symbol, as may be the various other signals 353-356 in the figure. The notation [t] in the figure may mean the number of a particular clock cycle, while the notation [t−1] may mean one clock cycle previous to [t]. Thus, the value of XOR_DEL[t−1] may be the same symbol as XOR_DAT[t] one clock cycle earlier.

Figure 4:
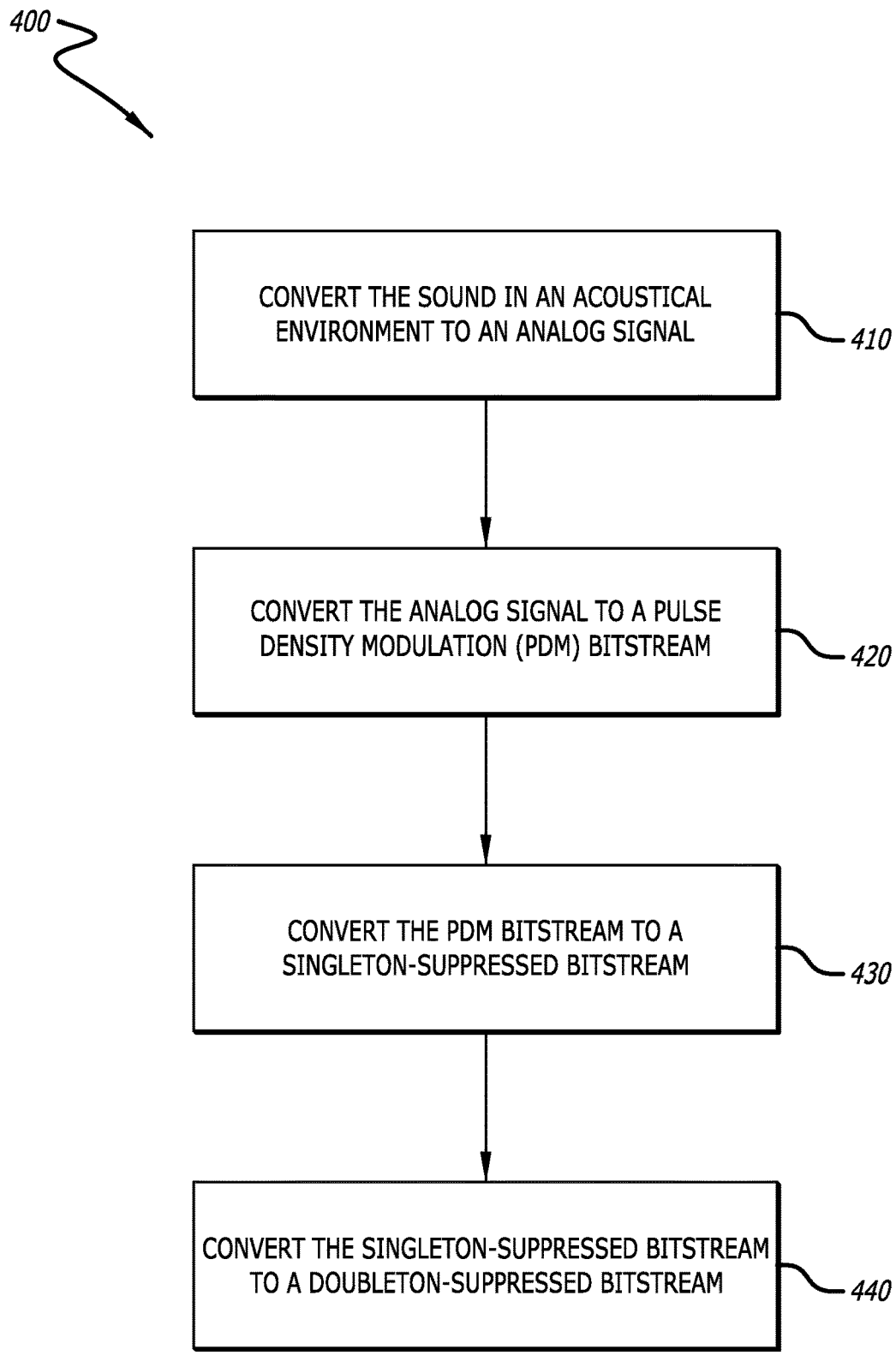
FIG. 4 is a flowchart depicting a process of operating a PDM microphone in accordance with an embodiment of the disclosure.

Referring to FIG. 4, a flowchart depicting a process 400 of operating a PDM microphone in accordance with an embodiment of the disclosure is shown. Process 400 may begin by converting the sound in an acoustical environment to an analog signal (block 410). This may be performed, for example, by a MEMS transducer or the like. The analog signal may be converted to a digital PDM signal (block 420). This may be performed, for example, by a sigma-delta modulator acting as an analog-to-digital converter. The PDM bitstream may be converted to a singleton suppressed bitstream (block 430). This may be performed, for example, by a singleton suppression decoder. The singleton suppressed bitstream may be converted to a doubleton suppressed bitstream (block 440). This may be performed, for example, by a doubleton suppression decoder.

Figure 5:
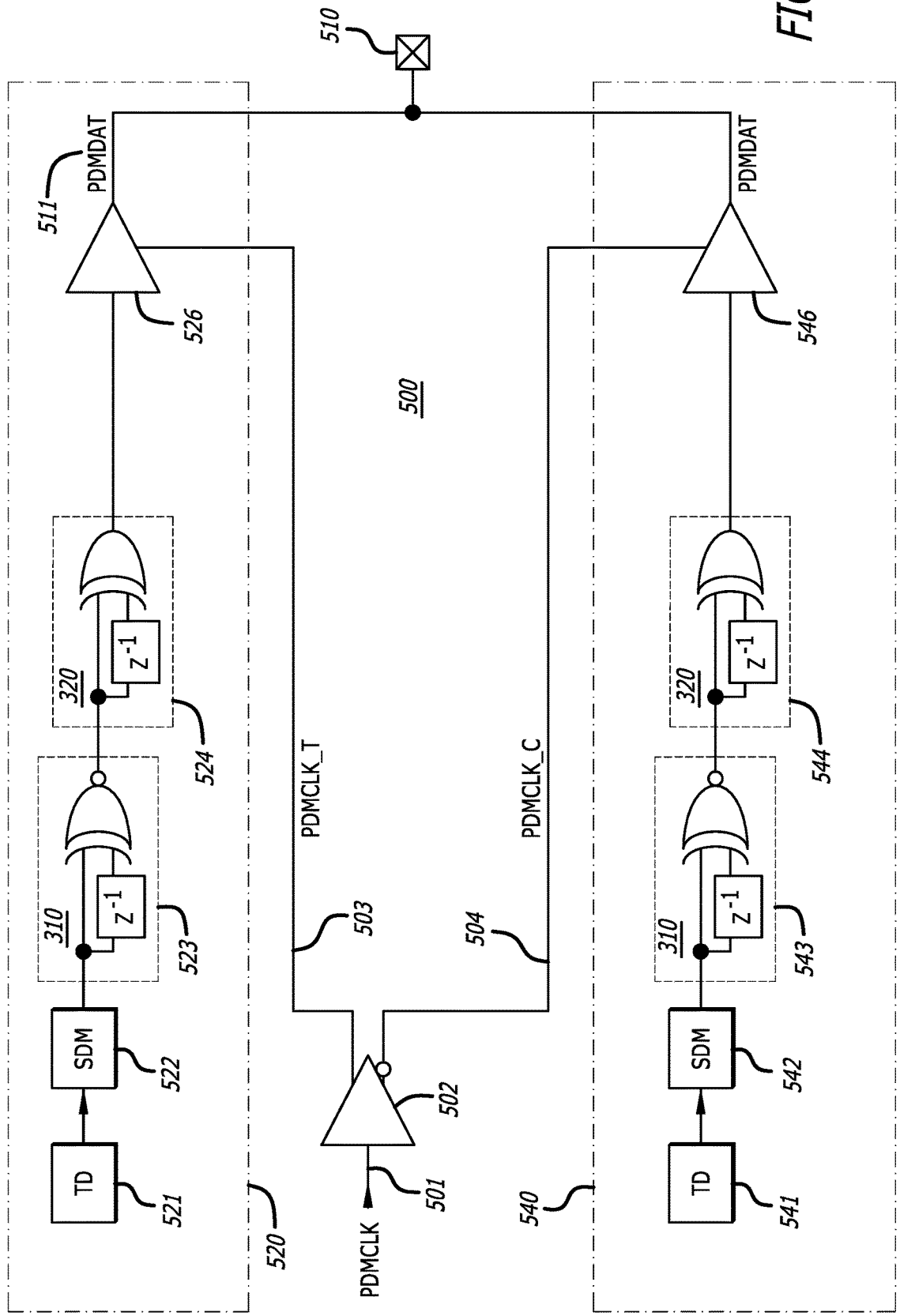
FIG. 5 is a schematic block diagram of a dual PDM microphone in accordance with an embodiment of the disclosure.

Referring to FIG. 5, a schematic block diagram of a dual PDM microphone in accordance with an embodiment of the disclosure is shown. Dual PDM microphone 500 comprises clock buffer 502, first microphone 520, and second microphone 540. PDMCLK 501 may be coupled to clock buffer 502 for distribution to the rest of the circuitry as PDMCLK_T 503 or PDMCLK_C 504 (where "_T" means "true" while "_C" means "complement" or the opposite logical polarity of "true"). The clocking scheme shown is exemplary only in order to emphasize events that happen during particular clock phases, and persons skilled in the art will realize that many different clock distribution schemes may be employed as a matter of design choice. Not all clock connections are shown. For example, the sigma-delta modulators 522 and 542, the singleton-suppression encoders 523 and 543, and the doubleton-suppression encoders 524 and 544 all have synchronous elements that are clocked by one of the clock signals in dual PDM microphone 500 but not shown in the figure.

First microphone 520 may comprise transducer 521, sigma-delta modulator 522, singleton-suppression encoder 523, doubleton-suppression encoder 524, and output driver 526. Transducer 521 may monitor sound in its acoustic environment to produce an analog signal that is converted to a PDM bitstream by sigma-delta modulator 522. Singleton-suppression encoder 523 may operate in a manner similar to singleton-suppression encoder 310 discussed in conjunction with FIG. 3A, converting the PDM bitstream to a singleton-suppressed bitstream. Doubleton-suppression encoder 524 may operate in a manner similar to doubleton-suppression encoder 320 discussed in conjunction with FIG. 3A, converting the singleton-suppressed bitstream to a doubleton-suppressed bitstream.

Output driver 526 may have a data input coupled to doubleton-suppression encoder 524, an enable input coupled to PDMCLK_T 503, and an output coupled to signal PDMDAT 511 coupled to external pad 510. In this embodiment, the doubleton-suppressed bitstream output from doubleton-suppression encoder 524 may be output to signal PDMDAT 511 coupled to external pad 510 during the phase of PDMCLK 401 where PDMCLK_T is equal to logic-1 (or "true"). PDMCLK_C may be coupled to the enable input of output driver 546 to ensure it outputs high-impedance when disabled so there is no contention in the driving of the signal PDMDAT 511 coupled to external pad 510.

Second microphone 540 may comprise transducer 541, sigma-delta modulator 542, singleton-suppression encoder 543, doubleton-suppression encoder 544, and output driver 546. Transducer 541 may monitor sound in its acoustic environment to produce an analog signal that is converted to a PDM bitstream by sigma-delta modulator 542. Singleton-suppression encoder 543 may operate in a manner similar to singleton-suppression encoder 310 discussed in conjunction with FIG. 3A, converting the PDM bitstream to a singleton-suppressed bitstream. Doubleton-suppression encoder 544 may operate in a manner similar to doubleton-suppression encoder 320 discussed in conjunction with FIG. 3A, converting the singleton-suppressed bitstream to a doubleton-suppressed bitstream.

Output driver 546 may have a data input coupled to doubleton-suppression encoder 544, an enable input coupled to PDMCLK_C 504, and an output coupled to signal PDM-DAT 511 coupled to external pad 510. In this embodiment, the doubleton-suppressed bitstream output from doubleton-suppression encoder 544 may be output to signal PDMDAT 511 coupled to external pad 510 during the phase of PDMCLK 401 where PDMCLK_C is equal to logic-1 (or "true"). PDMCLK_T may be coupled to the enable input of output driver 526 to ensure it outputs high-impedance when disabled so there is no contention in the driving of signal PDMDAT 511 coupled to external pad 510. Together output drivers 526 and 546 combine the two doubleton-suppressed bitstreams from doubleton-suppression encoders 524 and 544 to form an output bitstream carrying data on each edge (or phase) of PDMCLK 501 on signal PDMDAT 511 coupled to external pad 510.

Figure 6A:
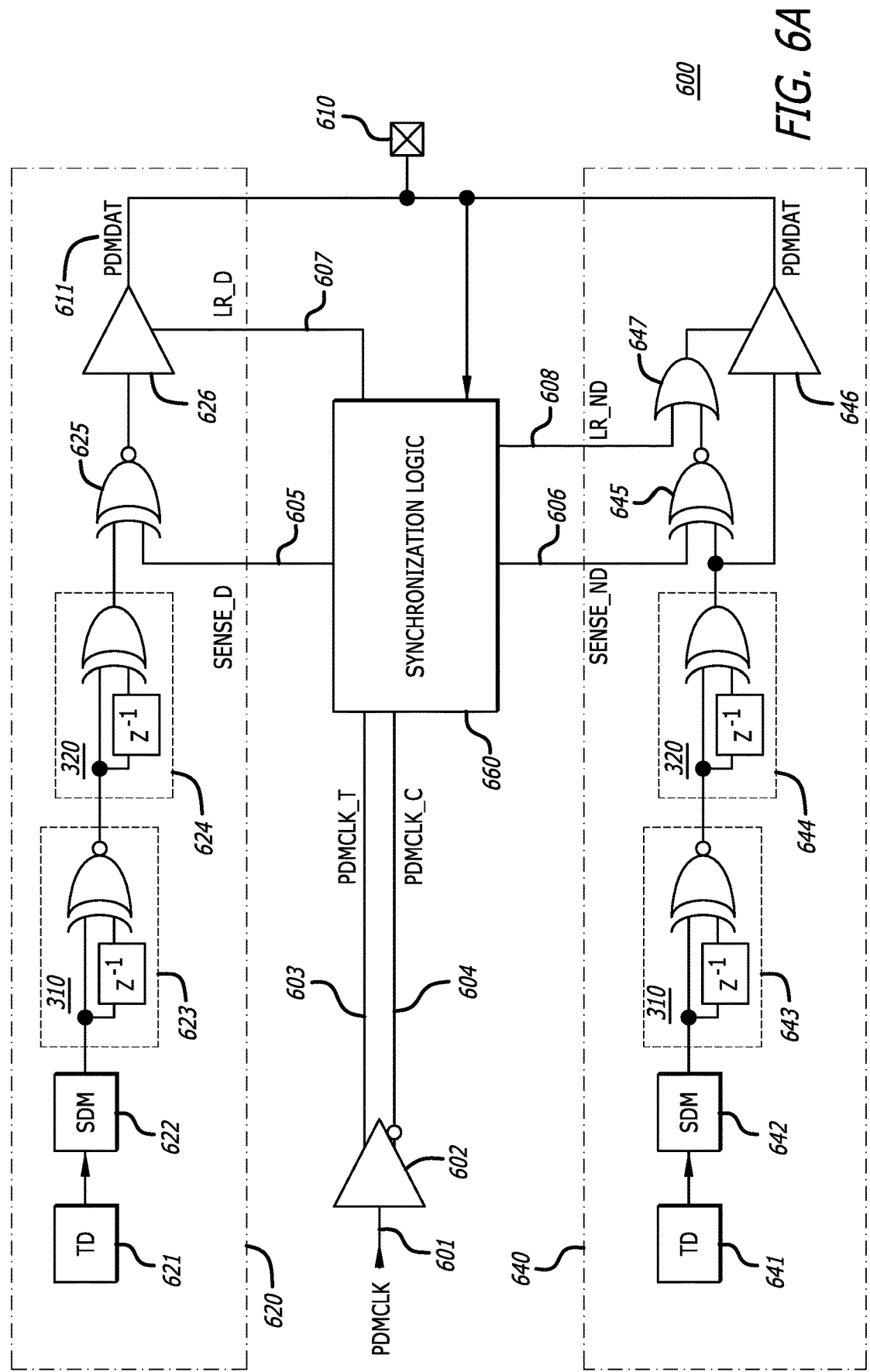
FIG. 6A is a schematic block diagram of a dual PDM microphone in accordance with an embodiment of the disclosure.

Referring to FIG. 6A, a schematic block diagram of a dual PDM microphone in accordance with an embodiment of the disclosure is shown. Dual PDM microphone 600 comprises clock buffer 602, dominant microphone 620, non-dominant microphone 640, and synchronizer logic 660. PDMCLK 101 may be coupled to clock buffer 602 for distribution to the rest of the circuitry as PDMCLK_T 603 or PDMCLK_C 604 (where "_T" means "true" while "_C" means "complement" or the opposite logical polarity of "true"). The clocking scheme shown is exemplary only in order to emphasize events that happen during particular clock phases, and persons skilled in the art will realize that many different clock distribution schemes may be employed as a matter of design choice. Not all clock connections are shown. For example, the sigma-delta modulators 622 and 642, the singleton-suppression encoders 623 and 643, and the doubleton-suppression encoders 624 and 644 all have synchronous elements that are clocked by one of the clock signals in dual PDM microphone 600.

Dominant microphone 620 may comprise transducer 621, sigma-delta modulator 622, singleton-suppression encoder 623, and doubleton-suppression encoder 624. Transducer 621 may monitor sound in its acoustic environment to produce an analog signal that is converted to a PDM bitstream by sigma-delta modulator 622. Singleton-suppression encoder 623 may operate in a manner similar to singleton-suppression encoder 310 discussed in conjunction with FIG. 3A, converting the PDM bitstream to a singleton-suppressed bitstream. Doubleton-suppression encoder 624 may operate in a manner similar to doubleton-suppression encoder 320 discussed in conjunction with FIG. 3A, converting the singleton-suppressed bitstream to a doubleton-suppressed bitstream.

Dominant microphone 620 further may comprise XNOR gate 625 and output driver 626. XNOR gate 625 may have a first input coupled to the output of doubleton-suppression encoder 624, a second input coupled to signal SENSE D 605 coupled to synchronization logic 660, and an output coupled to the data input of output driver 626. Output driver 626 may have a data input coupled to the output of XNOR gate 625, an enable signal coupled to signal LR_D 607 coupled to synchronization logic 660, and an output coupled to signal PDMDAT 611 coupled to external pad 610 and the output of output driver 646. Output driver 626 may present high-impedance to the signal PDMDAT 611 coupled to external pad 610 when disabled and may drive the data on its data input to the external pad 610 when enabled.

Non-dominant microphone 640 may comprise transducer 641, sigma-delta modulator 642, singleton-suppression encoder 643, and doubleton-suppression encoder 644. Transducer 641 may monitor sound in its acoustic environment to produce an analog signal that is converted to a PDM bitstream by sigma-delta modulator 642. Singleton-suppression encoder 643 may operate in a manner similar to singleton-suppression encoder 310 discussed in conjunction with FIG. 3A, converting the PDM bitstream to a singleton-suppressed bitstream. Doubleton-suppression encoder 644 may operate in a manner similar to doubleton-suppression encoder 320 discussed in conjunction with FIG. 3A, converting the singleton-suppressed bitstream to a doubleton-suppressed bitstream.

Non-dominant microphone 640 further may further comprise XNOR gate 645, output driver 646, and OR gate 647. XNOR gate 645 may have a first input coupled to the output of doubleton-suppression encoder 644, a second input coupled to signal SENSE ND 606 coupled to synchronization logic 660, and an output coupled to a first input of OR gate 647. Output driver 646 may have a data input coupled to the output of doubleton-suppression encoder 644, an enable signal coupled to the output of OR gate 647, and a data output coupled to signal PDMDAT 611 coupled to external pad 610 and the output of output driver 626. Output driver 646 may present high-impedance to the signal PDMDAT 611 coupled to external pad 610 when disabled and may drive the data on its data input to the external pad 610 when enabled. OR gate 647 may have a first input coupled to the output of XNOR gate 645, a second input coupled to signal LR_ND 608 coupled to synchronization logic 660, and an output coupled to the enable input of output driver 646.

The signals SENSED 605, SENSE ND 606, LR_D 607, and LR_ND 608 are used by synchronization logic 660 to coordinate the driving of signal PDMDAT 611 coupled to external pad 610 between output driver 626 and output driver 646, so there is no contention between them. In this context, "SENSE_x" means sensing the previous output by the opposite driver, while "LR_x" means left/right, which identifies each of the drivers as the "right" channel driver or the "left" channel driver to synchronization logic 660.

In some embodiments, synchronization logic 660 allows additional power savings relative to embodiments similar to dual PDM microphone 500 of FIG. 5, where the output bitstream simply ping-pongs back and forth between output drivers 526 and 546, and neither microphone is dominant. Dominant microphone 620 may function as a dominant microphone, driving signal PDMDAT 611 coupled to external pad 610 on either the rising or falling edge of the PDMCLK 601 and presenting high-impedance to the signal PDMDAT 611 coupled to external pad 610 on the other edge. Non-dominant microphone 640 senses the transition of dominant microphone 620 on the opposite clock edge, and then XNORs its signal with the signal of the prior clock edge of dominant microphone 620. If the signal is of the same polarity, it maintains high impedance rather than driving the line.

Figure 6B:
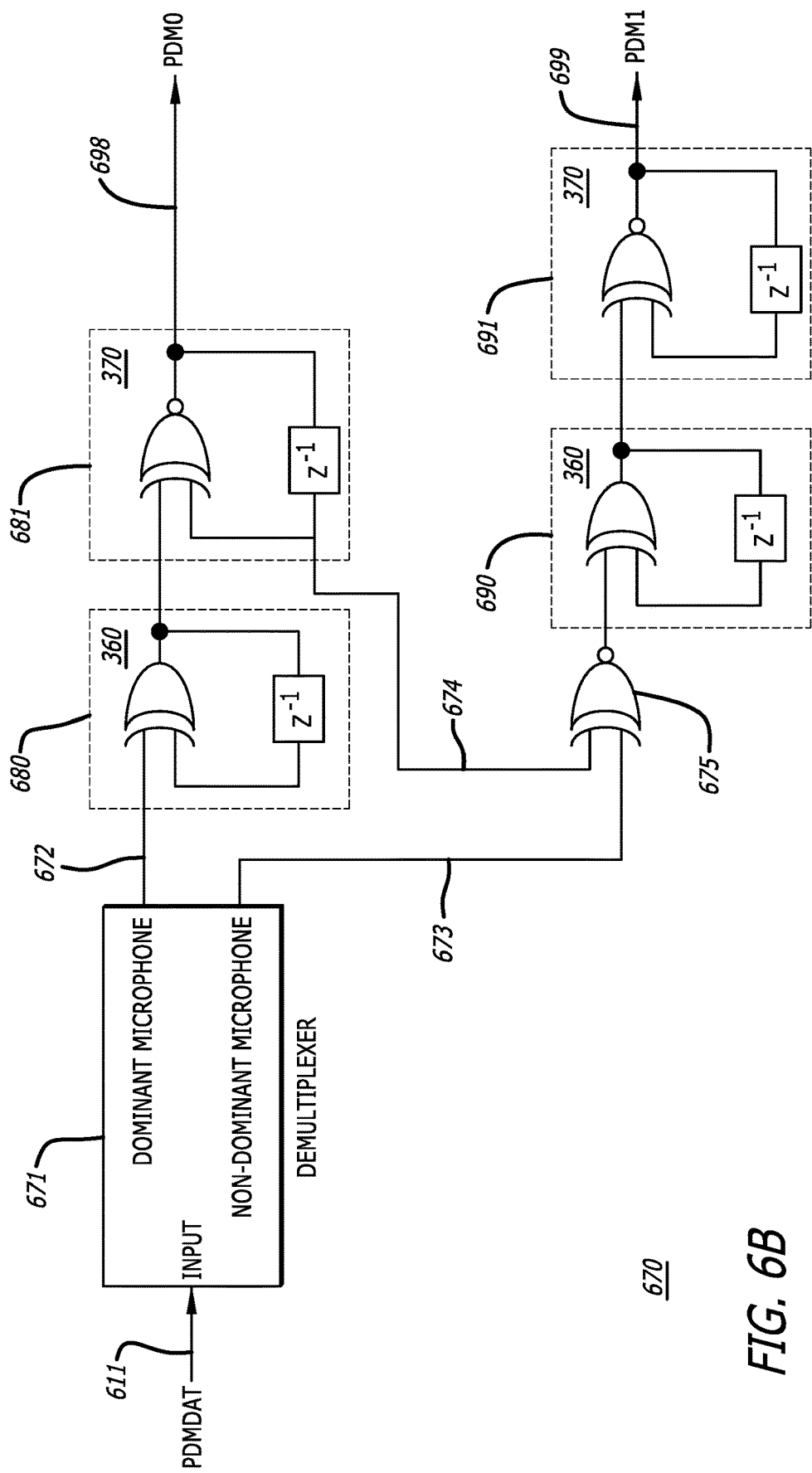
FIG. 6B is a schematic block diagram of a doubleton-suppression decoder and a singleton-suppression decoder for a dual PDM microphone in accordance with an embodiment of the disclosure.

Referring to FIG. 6B, a schematic block diagram of a doubleton-suppression decoder and a singleton-suppression decoder for a dual PDM microphone in accordance with an embodiment of the disclosure is shown. In some embodiments, this may be the signal PDMDAT 611 coupled to external pad 610, as illustrated in FIG. 6A. The receiver 670 may take the PDMDAT 611 bitstream and decode it back to the original PDM bitstreams from the sigma-delta modulators. This circuit may be synchronous to PDMCLK (not shown).

Since the PDMDAT 611 bitstream is two doubleton-suppressed bitstreams on alternating phases of PDMCLK, demultiplexer circuit 671 may separate them out into separate doubleton-suppressed bitstreams. Bitstream 672 may be the doubleton-suppressed bitstream for the dominant microphone like, for example, dominant microphone 620 from FIG. 6A, while bitstream 673 may be the doubleton-suppressed bitstream for the non-dominant microphone like, for example, non-dominant microphone 640 from FIG. 6A.

Bitstream 672 may be coupled to the input of doubleton-suppression decoder 680. The output of doubleton-suppression decoder 680 may be coupled to the input of singleton-suppression decoder 681. The output of singleton-suppression decoder 691 may be output as the restored PDM bitstream PDM0 698.

Bitstream 673 may be coupled to a first input of XNOR gate 675. A second input of XNOR gate 675 may be coupled to signal 674, which may be a version of PDM0 delayed by one PDMCLK cycle. The output of XNOR gate 675 may be coupled to the input of doubleton-suppression decoder 940. The output of doubleton-suppression decoder 690 may be coupled to the input of singleton-suppression decoder 691. The output of singleton-suppression decoder 691 may be output as the restored PDM bitstream PDM1 699.

Referring back to FIG. 6A, in some embodiments, the purpose of XNOR gate 675 may be to compensate for the differences in the dominant microphone 620 circuitry and the non-dominant microphone 640 circuitry. In dominant microphone 620, XNOR gate 625 may be coupled between doubleton-suppression decoder 624 and output driver 626. In non-dominant microphone 640, doubleton-suppression decoder 644 may be coupled directly to output driver 626 and skipping the XNOR function provided by XNOR gate 625 in dominant microphone 620. Thus, the XNOR gate 675 may be placed between the non-dominant bitstream 673 and doubleton-suppression decoder 690 of FIG. 6B to compensate.

Returning to FIG. 6B, doubleton-suppression decoders 680 and 690 may operate in a manner similar to that of doubleton-suppression decoder 360 described in conjunction with FIG. 3C, while singleton-suppression decoders 681 and 691 may operate in a manner similar to that of singleton-suppression decoder 370 of FIG. 3C.

Figure 7:
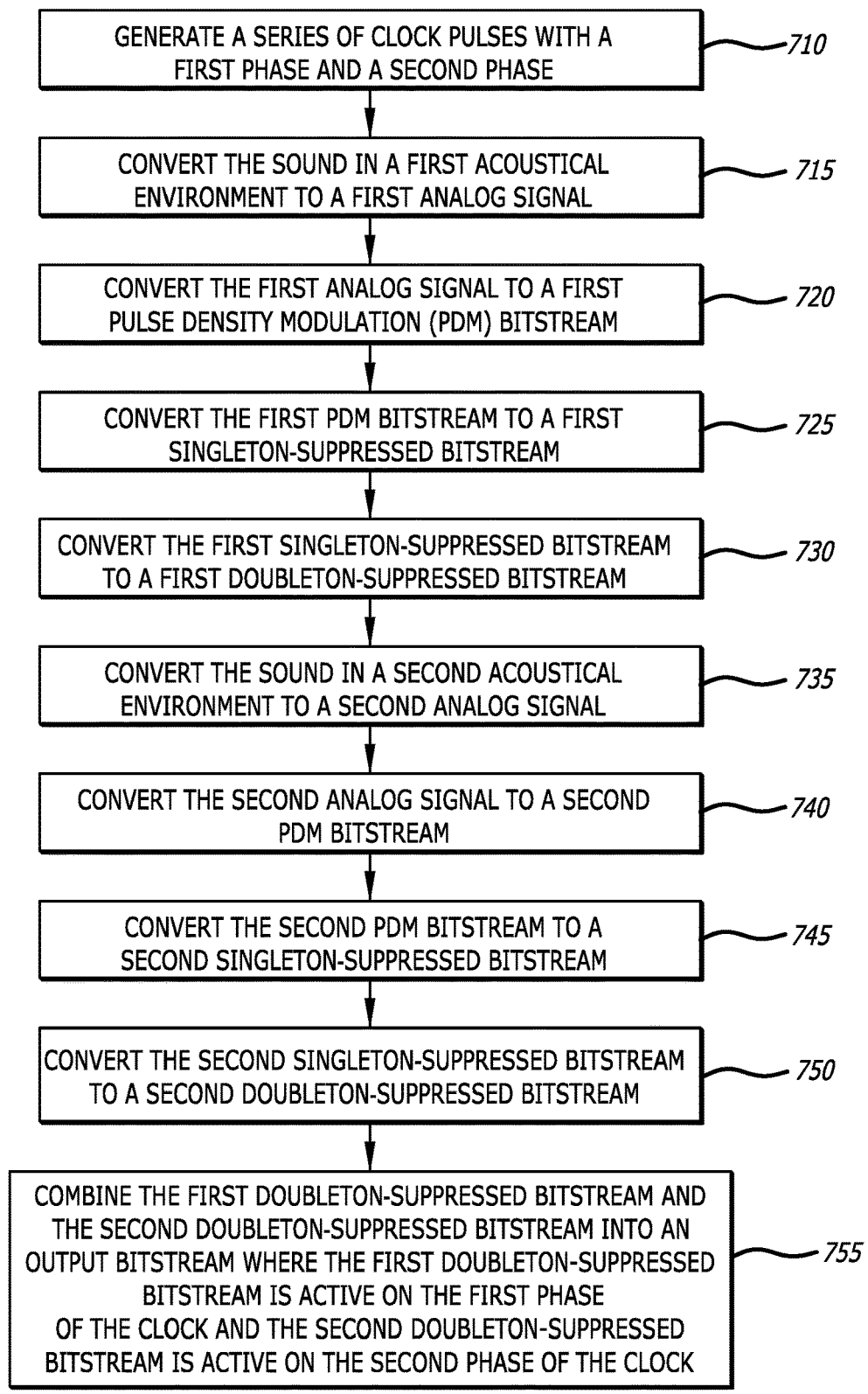
FIG. 7 is a flowchart depicting a process of operating a dual PDM microphone in accordance with an embodiment of the disclosure.

Referring to FIG. 7, a flowchart depicting a process 700 of operating a dual PDM microphone in accordance with an embodiment of the disclosure is shown. Process 700 may begin by generating a series of clock pulses, each having a first phase and a second phase (block 710). A first acoustical environment may be monitored, and any sound detected converted to a first analog signal (block 715). This may be performed, for example, by a first transducer. The first analog signal may be converted to a first PDM bitstream (block 720). This may be performed, for example, by a first sigma-delta modulator. The first PDM bitstream may be converted to a first singleton-suppressed bitstream (block 725). This may be performed, for example, by a first singleton-suppression encoder. The first singleton-suppressed bitstream may be converted to a first doubleton-suppressed bitstream (block 730). This may be performed, for example, by a first doubleton-suppression encoder.

A second acoustical environment may be monitored, and any sound detected converted to a second analog signal (block 735). This may be performed, for example, by a second transducer. The second analog signal may be converted to a second PDM bitstream (block 740). This may be performed, for example, by a second sigma-delta modulator. The second PDM bitstream may be converted to a second singleton-suppressed bitstream (block 745). This may be performed, for example, by a second singleton-suppression encoder. The second singleton-suppressed bitstream may be converted to a second doubleton-suppressed bitstream (block 750). This may be performed, for example, by a second doubleton-suppression encoder.

The first doubleton-suppressed bitstream and the second doubleton-suppressed bitstream may be converted into an output bitstream (block 755). The first doubleton-suppressed bitstream may be active in the output bitstream during the first phase of the clock. The second doubleton-suppressed bitstream may be active in the output bitstream during the second phase of the clock. This may be performed, for example, by a pair of enablable output drivers enabled on alternate phases of the clock by a synchronization logic.

Figure 8A:
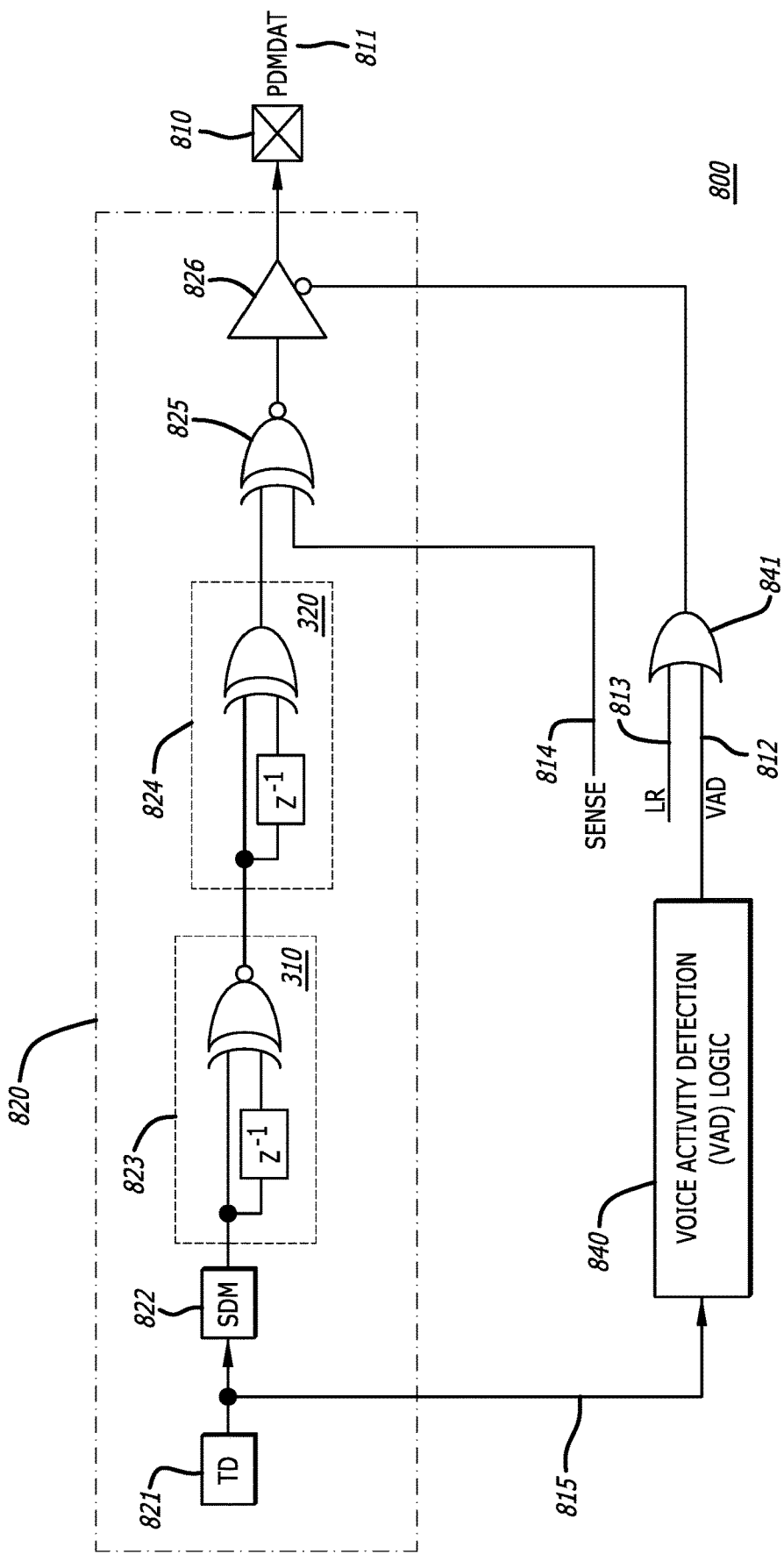
FIG. 8A is a schematic block diagram of a PDM microphone with voice activity detection (VAD) in accordance with an embodiment of the disclosure.

Referring to FIG. 8A, a schematic block diagram of a PDM microphone with voice activity detection (VAD) in accordance with an embodiment of the disclosure is shown. In some embodiments, it is desirable to put a PDM microphone into a low power state. In certain embodiments, it is desirable for a PDM microphone to power down most (but not all—part of it has to be "awake" to monitor for acoustic activity) of its circuitry (particularly the PDMDAT drivers) and "go to sleep" automatically when there is too little sound to amplify. Similarly, it is desirable for the microphone to "wake up" and power itself up when sufficient sound is detected.

Microphone 800 may comprise PDM microphone 820, VAD logic 840, and OR gate 841. PDM microphone 820 may comprise transducer 821, which may monitor the sound in its acoustic environment and produce an analog signal that may be converted to a PDM bitstream by sigma-delta modulator 822. Singleton-suppression encoder 823 may convert the PDM bitstream to a singleton-suppressed bitstream which may be converted to a doubleton-suppressed bitstream by doubleton-suppression encoder 824.

In various embodiments, a second PDM microphone (not shown) and a synchronization logic (not shown) may be present. XNOR gate 825 and OR gate 841 may be used to interface between the two PDM microphones. XNOR gate 825 may have a first input coupled to the doubleton-suppressed bitstream output by doubleton-suppression encoder 824, a second input coupled to a SENSE signal 814, and an output coupled to a data input of output driver 826. Output driver 826 may have a data input coupled to the output of XNOR gate 825, an enable input coupled to the output of OR gate 841, and a data output coupled to the signal PDMDAT 811 coupled to external pad 810. OR gate 841 may have a first input coupled to signal LR 813, a second input coupled to VAD signal 812, and an output coupled to the enable input of output driver 826.

In some embodiments, VAD logic 840 monitors the acoustic energy in the acoustic environment monitored by transducer 821 via signal line 815. If the acoustic energy is below a predefined level, then VAD logic 840 may disable output driver 826 via VAD signal 812 and OR gate 841. If the acoustic energy is above a predefined level, then VAD logic 840 may enable output driver 826 via VAD signal 812 and OR gate 841.

In various embodiments, a second PDM microphone (not shown) with a second transducer (not shown) may be present. Synchronization logic (not shown) may also be present. SENSE signal 814 and LR 813 may be used by the synchronization logic to combine the two output bitstreams at signal PDMDAT 811 coupled to external pad 810. VAD logic may monitor the acoustic energy of both acoustic environments via the transducer 821 and the transducer of the second microphone (not shown). If the acoustic energy is above a predefined level in either acoustic environment, then the microphone 800 may wake up from a sleep mode, and signal PDMDAT 811 coupled to external pad 810 is driven. If the acoustic energy is below the predefined level in both acoustic environments, then the microphone 800 may go to sleep until sufficient acoustic energy is detected.

Figure 8B:
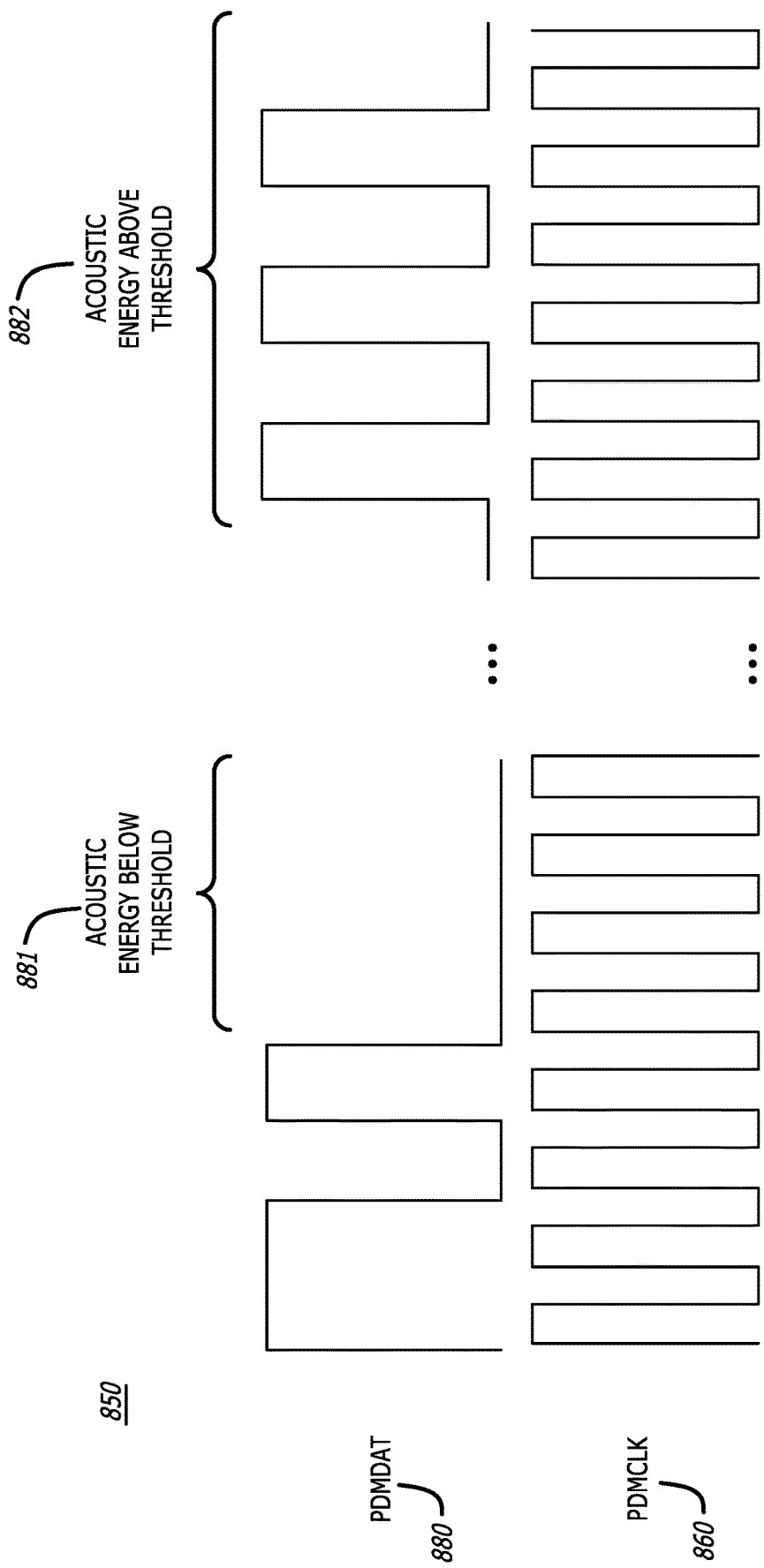
FIG. 8B is a waveform diagram of the operation of a PDM microphone with VAD in accordance with an embodiment of the disclosure.

Referring to FIG. 8B, a waveform diagram of the operation of a PDM microphone with VAD in accordance with an embodiment of the disclosure is shown. The waveform 850 may comprise waveform PDMCLK 860 and PDMDAT 880. PDMCLK may be a free-running clock. Waveform PDMDAT 880 may have a time period 881 when low acoustic energy (below a predefined threshold) is detected. During that time, waveform PDMDAT 880 may be disabled (shown as a period of continuous logic-0 in the figure). Waveform PDMDAT 880 may have a second time period 882 when sufficient acoustic energy (above a predefined threshold) may be detected. During that time period, waveform PDMDAT 880 may operate normally transmitting data.

Figure 9:
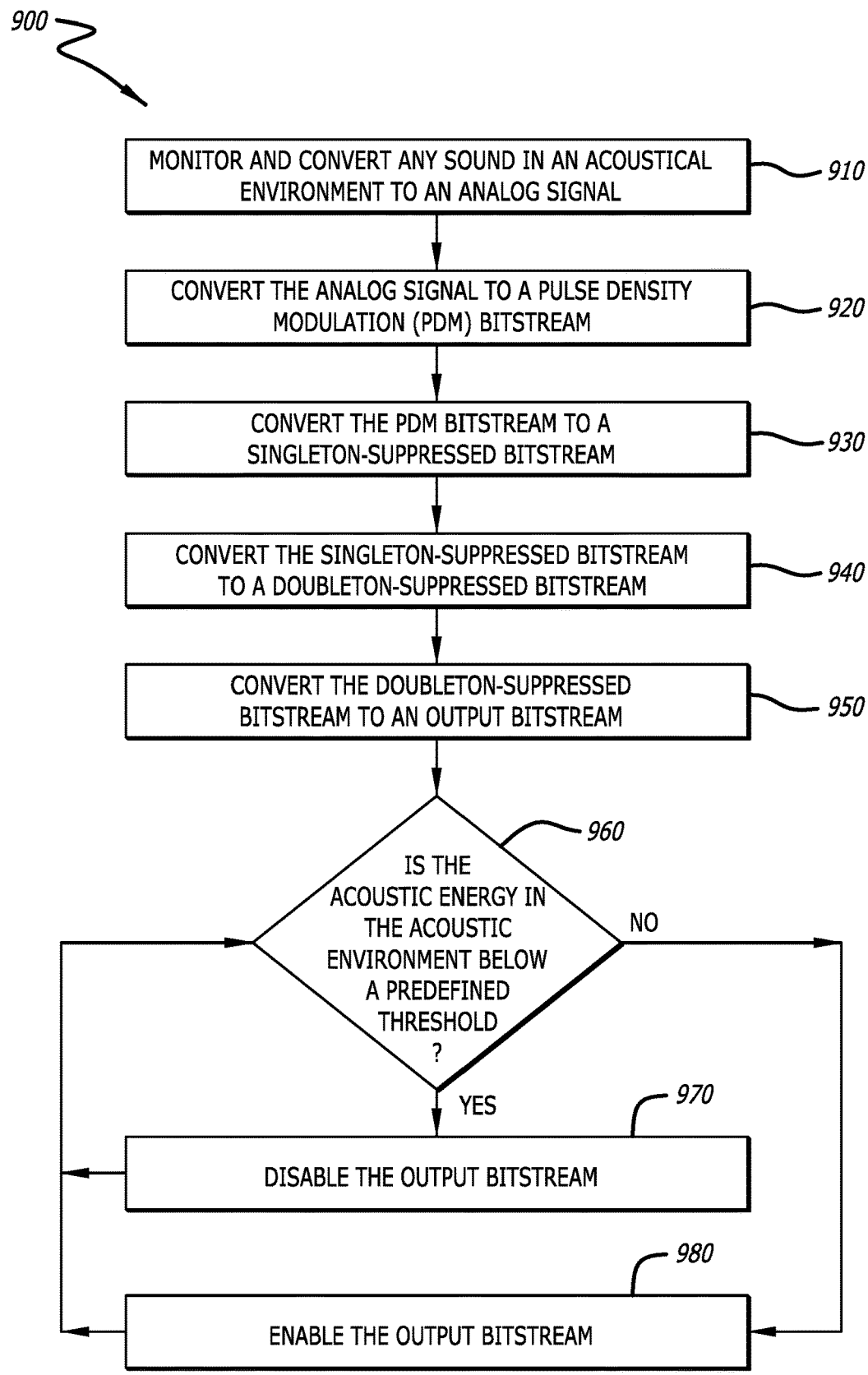
FIG. 9 is a flowchart depicting a process of operating a single PDM microphone in accordance with an embodiment of the disclosure.

Referring to FIG. 9, a flowchart depicting a process 900 of operating a single PDM microphone in accordance with an embodiment of the disclosure is shown. Process 900 may begin by monitoring an acoustical environment and converting any sound detected to an analog signal (block 910). This may be performed, for example, by a transducer. The analog signal may be converted to a PDM bitstream (block 920). This may be performed, for example, by a sigma-delta modulator.

The PDM bitstream may be converted to a singleton-suppressed bitstream (block 930). This may be performed, for example, by a singleton-suppression encoder. The singleton-suppressed bitstream may be converted to a doubleton-suppressed bitstream (block 940). This may be performed, for example, by a doubleton-suppression encoder.

The doubleton-suppressed bitstream may be converted to an output bitstream (block 950). This may be performed, for example, by an output driver which can transmit data when active and present high-impedance when inactive. In alternate embodiments, the output driver may be left active the entire time since there is no chance of contention with another output driver.

The acoustical environment may be monitored, and a determination may be made as to whether the acoustic energy in the acoustic environment is below a predefined threshold (block 960). If so, then the output bitstream may be disabled (block 970), and monitoring of the acoustic energy continues (block 960). If the acoustic energy is above the predetermined threshold, then the output bitstream may be enabled (block 980), and monitoring of the acoustic energy continues (block 960).

Figure 10A:
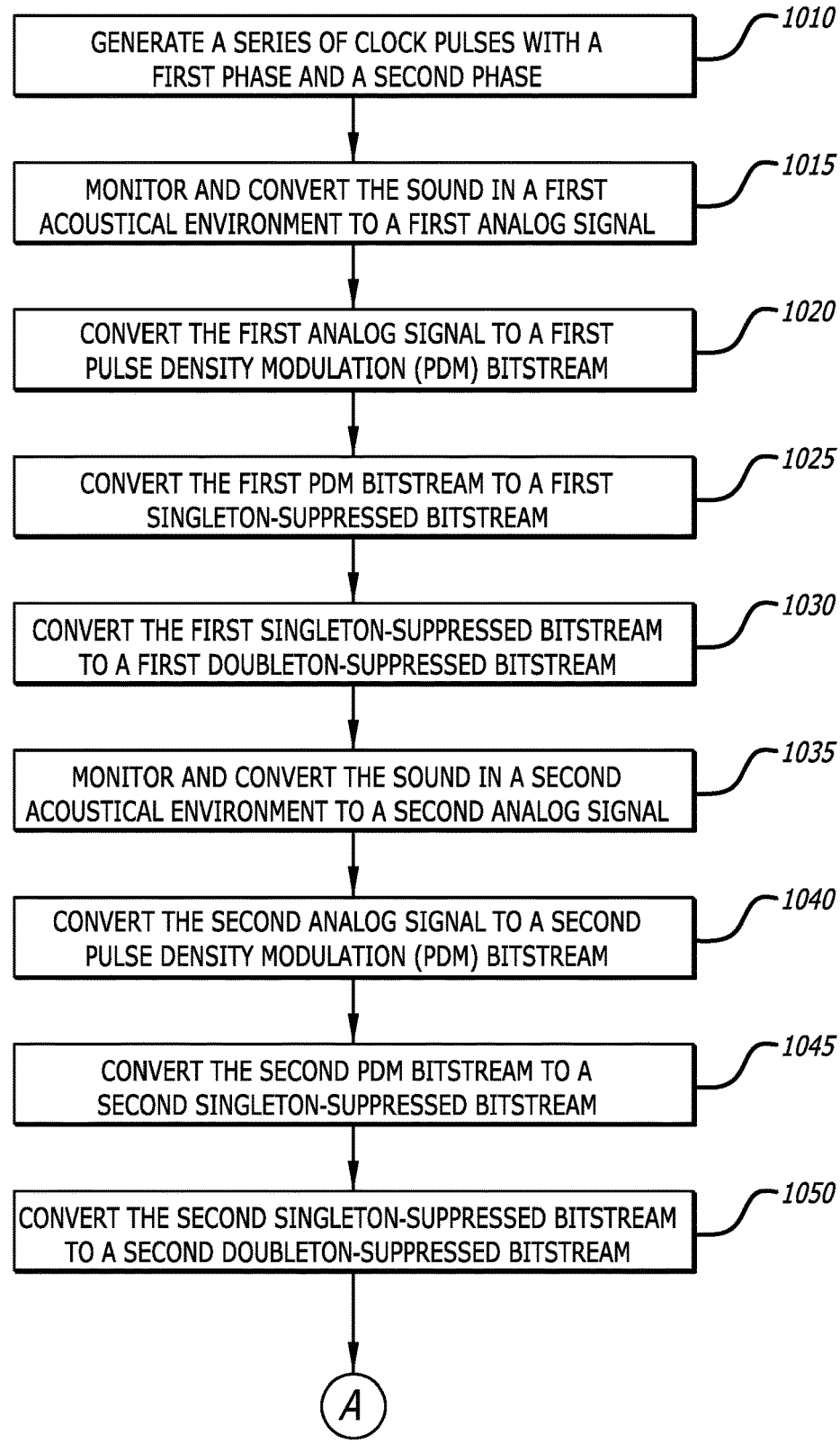
FIG. 10A and FIG. 10B are flowcharts depicting a process of operating a dual PDM microphone in accordance with an embodiment of the disclosure.
Figure 10B:
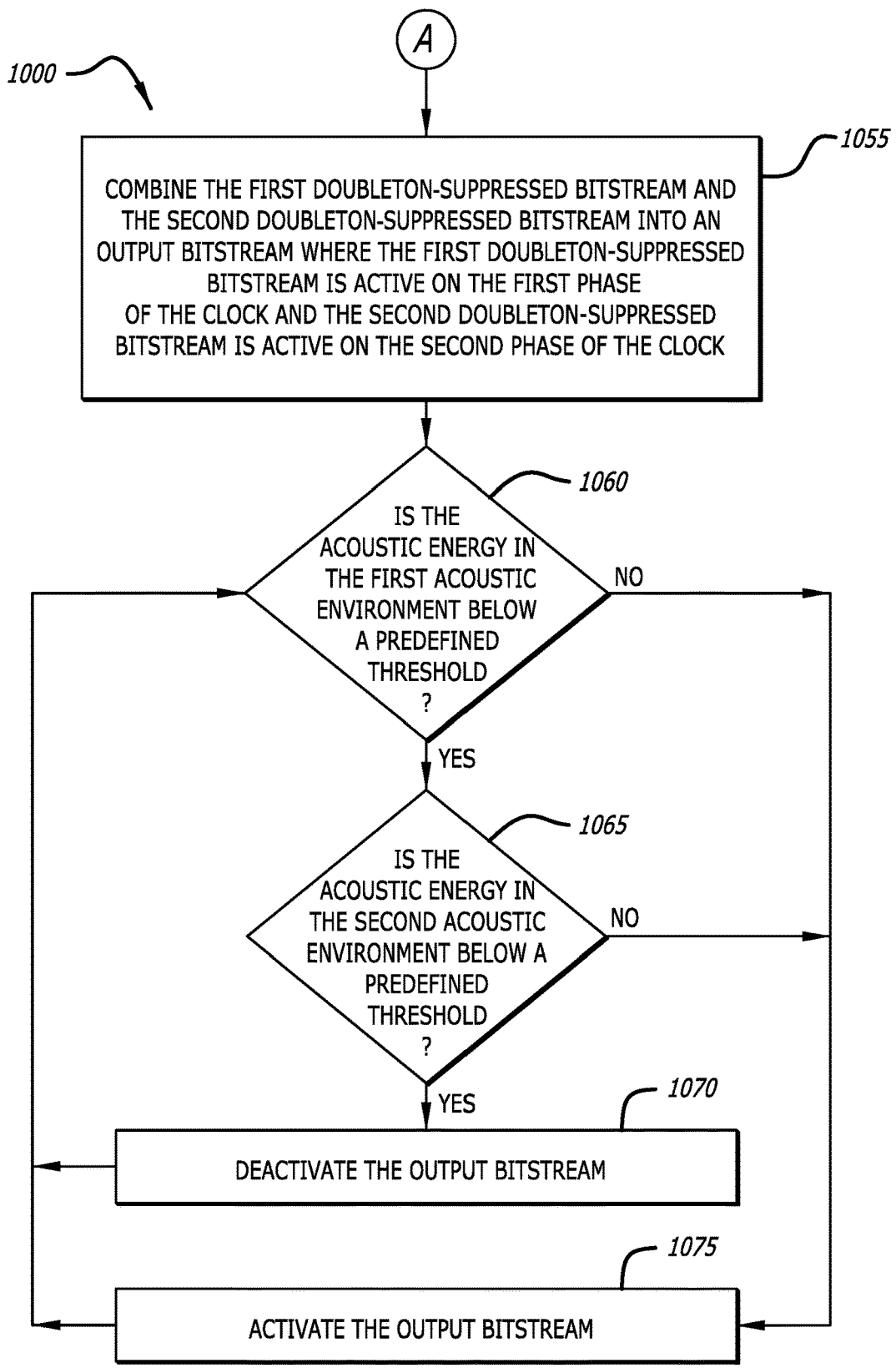

Referring to FIG. 10A and FIG. 10B, flowcharts depicting process 1000 of operating a dual PDM microphone in accordance with an embodiment of the disclosure is shown. Process 1000 may begin by generating a series of clock pulses, each having a first phase and a second phase (block 1010). A first acoustical environment may be monitored, and any sound detected converted to a first analog signal (block 1015). This may be performed, for example, by a first transducer. The first analog signal may be converted to a first PDM bitstream (block 1020). This may be performed, for example, by a first sigma-delta modulator. The first PDM bitstream may be converted to a first singleton-suppressed bitstream (block 1025). This may be performed, for example, by a first singleton-suppression encoder. The first singleton-suppressed bitstream may be converted to a first doubleton-suppressed bitstream (block 1030). This may be performed, for example, by a first doubleton-suppression encoder.

A second acoustical environment may be monitored, and any sound detected converted to a second analog signal (block 1035). This may be performed, for example, by a second transducer. The second analog signal may be converted to a second PDM bitstream (block 1040). This may be performed, for example, by a second sigma-delta modulator. The second PDM bitstream may be converted to a second singleton-suppressed bitstream (block 1045). This may be performed, for example, by a second singleton-suppression encoder. The second singleton-suppressed bitstream may be converted to a second doubleton-suppressed bitstream (block 1050). This may be performed, for example, by a second doubleton-suppression encoder.

The first doubleton-suppressed bitstream and the second doubleton-suppressed bitstream may be converted into an output bitstream (block 1055). The first doubleton-suppressed bitstream may be active in the output bitstream during the first phase of the clock, and the second doubleton-suppressed bitstream may be active in the output bitstream during the second phase of the clock. This may be performed, for example, by a pair of enablable output drivers enabled on alternate phases of the clock by a synchronization logic.

The first acoustical environment may be monitored, and a determination may be made as to whether the acoustic energy in the first acoustic environment is below a predefined threshold (block 1060). If no, then the output bitstream may be activated (block 1075), and the monitoring continues (block 1060). If yes, then the second acoustical environment may be monitored.

A determination may be made as to whether the acoustic energy in the second acoustic environment is below a predefined threshold (block 1065). If yes, then the output bitstream may be deactivated (block 1070), and the monitoring continues (block 1060). If no, then the output bitstream may be activated (block 1075), and the monitoring continues (block 1060). At times when the output bitstream may be disabled, various other circuits in the dual PDM microphone may also be powered down.

Figure 11A:
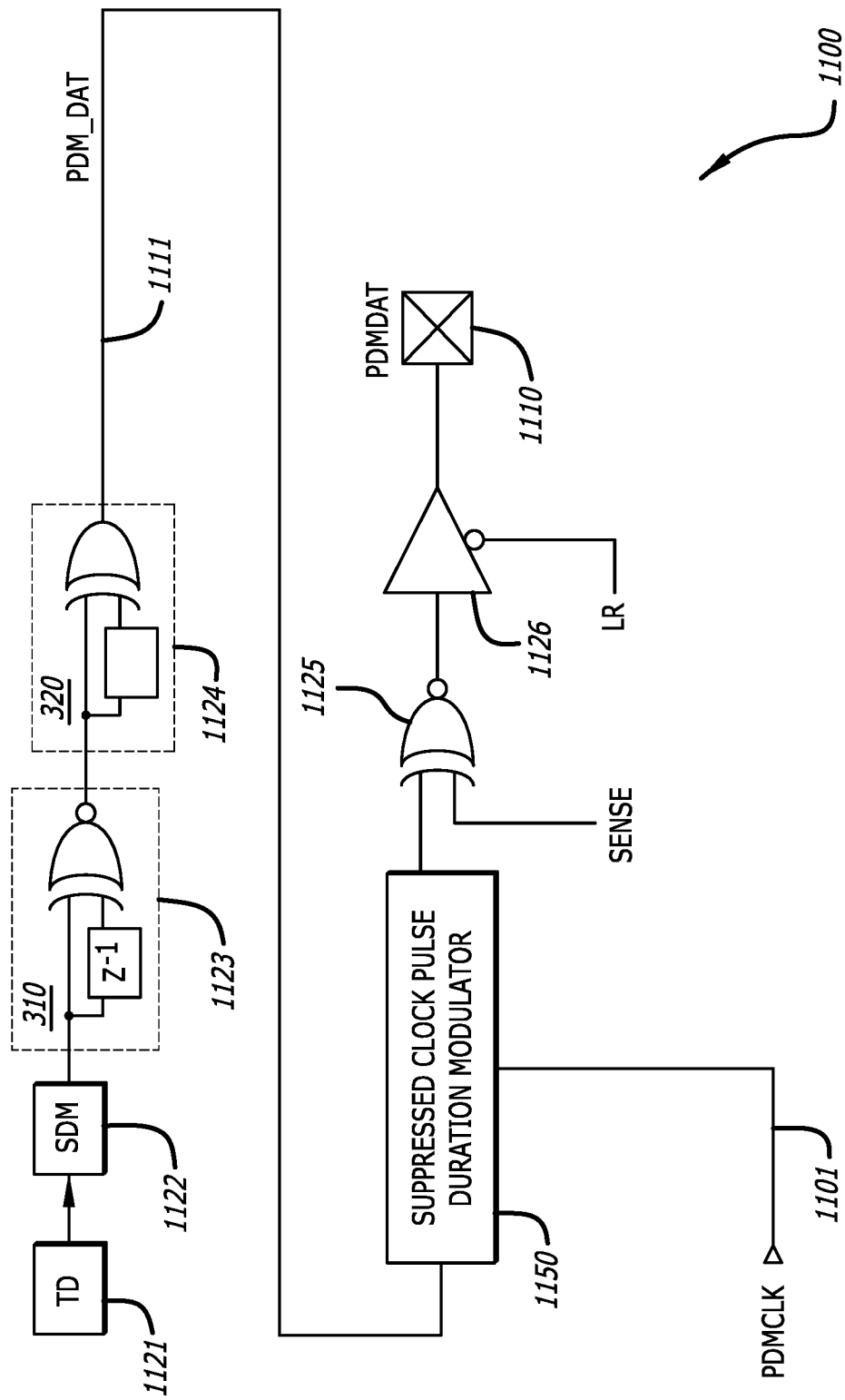
FIG. 11A is a schematic block diagram of a PDM microphone with suppressed clock pulse duration modulation in accordance with an embodiment of the disclosure.

Referring to FIG. 11A, a schematic block diagram of a PDM microphone with suppressed clock pulse duration modulation in accordance with an embodiment of the disclosure is shown. PDM microphone 1100 may comprise PDMCLK 1101 input, PDMDAT output pad 1110, transducer 1121, sigma-delta modulator 1122, singleton-suppression encoder 1123, doubleton-suppression encoder 1124, Suppressed Clock Pulse Duration Modulator (SCPDM) 1150, XNOR gate 1125, and output driver 1126. Transducer 1121 may convert sound in its acoustic environment to an analog signal which may be further converted to a PDM bitstream by sigma-delta modulator 1122. The PDM bitstream may be converted into a singleton-suppressed bitstream by singleton-suppression encoder 1123 and may be further converted into a doubleton-suppressed bitstream signal PDM_DAT 1111 by doubleton-suppression encoder 1124.

SCPDM 1150 is coupled between the internal signal PDM_DAT 1111 and XNOR gate 1125 to provide additional power-saving modulation before XNOR gate 1125 and output driver 1126 transmit the data. The signals SENSE and LR may be for use by a synchronization logic (not shown) if one is present in a dual microphone embodiment. SCPDM 1150 may divide PDMCLK 1101 by two and XOR it with the internal PDM bitstream PDM_DAT 1111 with appropriate timing adjustments. This may produce a waveform with approximately 50% of the transitions in PDM_DAT 1111.

Referring to FIG. 11B, a waveform diagram of the operation of a PDM microphone with suppressed clock pulse duration modulation transmitter in accordance with an embodiment of the disclosure is shown. The waveform diagram 1160 comprises four waveforms PDMCLK_TX 1161, PDMCLK/2_TX 1162, PDMDAT TX 1163, and SCPDM_TX 1164. The suffix "_TX" may indicate the version of the waveform on the transmitter end. Only waveform SCPDM_TX 1164 may actually be transmitted. Waveform PDMCLK_TX 1161 may be a free-running clock, and waveform PDMCLK/2_TX 1162 may be a free-running clock of half the frequency. In many embodiments, waveform PDMDAT TX 1163 may be a doubleton-suppression PDM bitstream. Waveform PDMCLK/2_TX 1162 may be XORed with waveform PDMDAT TX 1163 (as indicated by character 1165) to generate waveform SCPDM_TX 1164 (as indicated by character 1166), which may be the suppressed clock pulse duration modulator waveform carrying the actual information to be transmitted.

Referring to FIG. 11C, a waveform diagram of the operation of a PDM microphone with suppressed clock pulse duration modulation receiver in accordance with an embodiment of the disclosure is shown. The timing diagram 1170 comprises four waveforms PDMCLK RX 1171, PDMCLK/2_RX 1172, SCPDM RX 1173, and PDMDAT RX 1174. The suffix "_RX" may indicate the version of the waveform on the receiver end. Only waveform SCPDM RX 1173 may actually be received. Waveform PDMCLK RX 1171 may be a free-running clock, and waveform PDMCLK/2_RX 1172 may be a free-running clock of half the frequency. Waveform PDMCLK/2_RX 1172 may be XORed with waveform PDMCLK/2_RX 1172 (as indicated by character 1175) to generate waveform SCPDM RX 1173 (as indicated by character 1176), which is the restored bitstream of PDMDAT TX 1163. The advantage of this scheme may be that statistically, it will reduce the number of transitions by about 50%, while the disadvantage may be that there is phase ambiguity between PDMCLK/2_TX 1162 and PDMCLK/2_RX 1172 that may need to be resolved to decode the bitstream correctly.

Referring to FIG. 12, a flowchart depicting a process 1200 of operating a PDM microphone in accordance with an embodiment of the disclosure is shown. Process 1200 may begin by converting the sound in an acoustical environment to an analog signal (block 1210). This may be performed, for example, by a MEMS transducer or the like. The analog signal may be converted to a digital PDM bitstream signal (block 1220). This may be performed, for example, by a sigma-delta modulator acting as an analog-to-digital converter. The PDM bitstream may be converted to a singleton suppressed bitstream (block 1230). This may be performed, for example, by a singleton suppression decoder. The singleton suppressed bitstream may be converted to a doubleton suppressed bitstream (block 1240). This may be performed, for example, by a doubleton suppression decoder. The doubleton suppressed bitstream may be converted to a suppressed clock pulse duration modulated bitstream (block 1250). This may be performed, for example, by a suppressed clock pulse duration modulator. The suppressed clock pulse duration modulated bitstream may be converted to an output bitstream (block 1260). This may be performed, for example, by an output driver which can transmit data when active and present high-impedance when inactive.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A device comprising:
   a clock source configured to distribute a series of clock pulses, wherein:
      each clock pulse comprises a first phase and a second phase; and
   a first microphone, comprising:
      a first transducer,
      a first sigma-delta modulator,
      a first singleton-suppression encoder,
      a first doubleton-suppression encoder, and
      a first output driver.

2. The device of claim 1, wherein:
   the first transducer is configured to convert sound in a first acoustic environment to a first analog signal,
   the first sigma-delta modulator is configured to convert the first analog signal to a first pulse density modulated bitstream, each bit of the bitstream comprising a symbol,
   the first singleton-suppression encoder is configured to convert the first pulse density modulated bitstream to a first singleton-suppressed bitstream, each bit of the bitstream comprising a symbol,
   the first doubleton-suppression encoder is configured to convert the first singleton-suppressed bitstream to a first doubleton-suppressed bitstream, each bit of the bitstream comprising a symbol, and
   the first output driver is configured to transmit the first doubleton-suppressed bitstream as a first output bitstream, each bit of the bitstream comprising a symbol.

3. The device of claim 2, wherein the first singleton-suppression encoder performs an exclusive-NOR (XNOR) function on the current input symbol and the previous input symbol to generate an output symbol.

4. The device of claim 3, wherein the first second doubleton-suppression encoder performs an exclusive-OOR (XOR) function on the current input symbol and the previous input symbol to generate an output symbol.

5. The device of claim 4, further comprising:
a second microphone, comprising:
   a second transducer,
   a second sigma-delta modulator,
   a second singleton-suppression encoder,
   a second doubleton-suppression encoder, and
   a second output driver.

6. The device of claim 5, wherein:
the second transducer is configured to convert sound in a second acoustic environment to a second analog signal,
the second sigma-delta modulator is configured to convert the second analog signal to a second pulse density modulated bitstream, each bit of the bitstream comprising a symbol,
the second singleton-suppression encoder is configured to convert the second pulse density modulated bitstream to a second singleton-suppressed bitstream, each bit of the bitstream comprising a symbol,
the second doubleton-suppression encoder is configured to convert the second singleton-suppressed bitstream to a second doubleton-suppressed bitstream, each bit of the bitstream comprising a symbol, and
the second output driver is configured to transmit the second doubleton-suppressed bitstream as a second output bitstream, each bit of the bitstream comprising a symbol.

7. The device of claim 6, further comprising:
a device output; and
a synchronization logic, wherein:
the first output driver further comprises:
   a first output driver data input coupled to the first doubleton-suppression encoder,
   a first output driver enable input coupled to the synchronization logic, and
   a first output driver data output coupled to the device output;
the second output driver further comprises:
   a second output driver data input coupled to the second doubleton-suppression encoder,
   a second output driver enable input coupled to the synchronization logic, and
   a second output driver data coupled to the device output.

8. The device of claim 7, wherein:
the synchronization logic is configured to:
   enable the first output driver and disable the second output driver during the first phase of the clock; and
   disable the first output driver and enable the second output driver during the second phase of the clock.

9. The device of claim 4, further comprising:
a Voice Activity Detection (VAD) logic, wherein:
   if the VAD logic detects acoustic energy above a predefined threshold, then the output bitstream is enabled, and
   if the VAD logic detects acoustic energy below a predefined threshold, then the output bitstream is disabled.

10. The device of claim 4, further comprising a suppressed carrier pulse width modulation logic coupled between the first doubleton-suppression encoder and the first output driver.

* * * * *